United States Patent
Yang et al.

(10) Patent No.: US 12,100,655 B2
(45) Date of Patent: Sep. 24, 2024

(54) INTEGRATED CIRCUITS HAVING SIGNAL LINES FORMED WITH DOUBLE PATTERNING

(71) Applicant: TAIWAN SEMICONDUCTOR MANUFACTURING COMPANY, LTD., Hsinchu (TW)

(72) Inventors: Chung-Chieh Yang, Hsinchu (TW); Ching-Ting Lu, Hsinchu (TW); Yung-Chow Peng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 87 days.

(21) Appl. No.: 17/746,381

(22) Filed: May 17, 2022

(65) Prior Publication Data
US 2023/0378060 A1    Nov. 23, 2023

(51) Int. Cl.
*H01L 23/528* (2006.01)
*H01L 21/3213* (2006.01)
*H01L 21/768* (2006.01)
*H01L 23/522* (2006.01)

(52) U.S. Cl.
CPC ...... *H01L 23/528* (2013.01); *H01L 21/32135* (2013.01); *H01L 21/32139* (2013.01); *H01L 21/76892* (2013.01); *H01L 23/5223* (2013.01)

(58) Field of Classification Search
CPC ......... H01L 21/32135; H01L 21/32139; H01L 23/528; H01L 23/5223; H01L 21/76892
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |
| 2014/0040838 A1 | 2/2014 | Liu et al. |
| 2015/0171079 A1 | 6/2015 | Or-Bach et al. |
| 2015/0278429 A1 | 10/2015 | Chang |
| 2017/0186687 A1* | 6/2017 | Ning .................. H01L 23/5226 |

FOREIGN PATENT DOCUMENTS

| TW | 201336038 | 9/2013 |
| TW | 202201565 | 1/2022 |
| TW | 202218045 | 5/2022 |

* cited by examiner

*Primary Examiner* — Walter H Swanson
(74) *Attorney, Agent, or Firm* — Hauptman Ham, LLP

(57) ABSTRACT

An integrated circuit includes an array of metal conducting lines in a metal layer overlying an insulation layer supported by a substrate, a first metal segment lineup having multiple metal segments in the metal layer between a first metal conducting line and a second metal conducting line in the array of metal conducting lines, and an electric circuit having a first input and a second input. The first input is connected to the first metal conducting line and the second input is connected to the second metal conducting line, and a first length of the first metal conducting line is equal to a second length of the second metal conducting line.

20 Claims, 35 Drawing Sheets

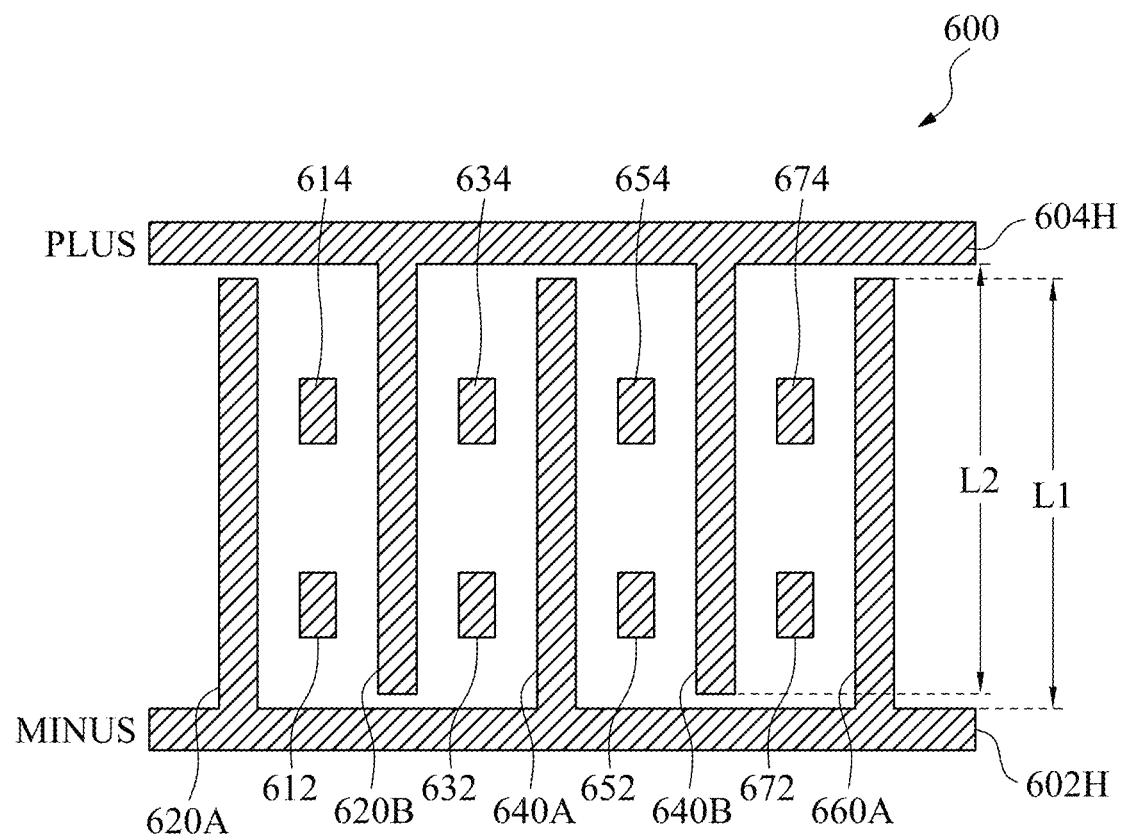
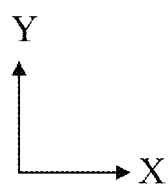
Fig. 6B

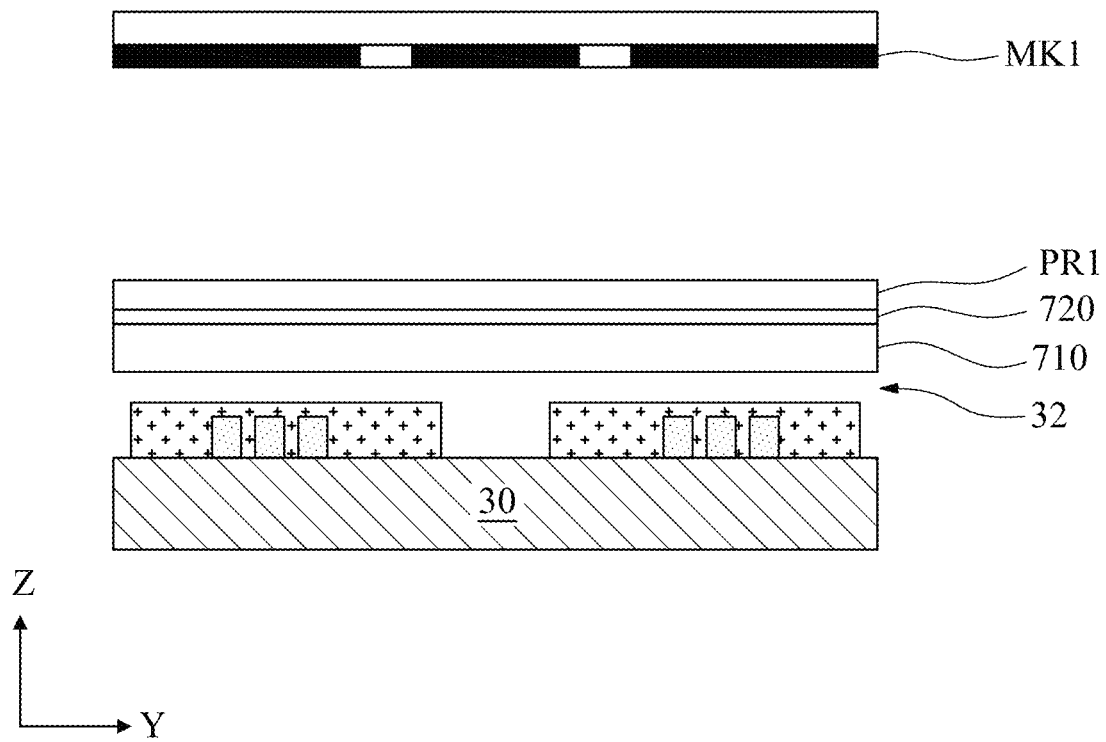
Fig. 8A1
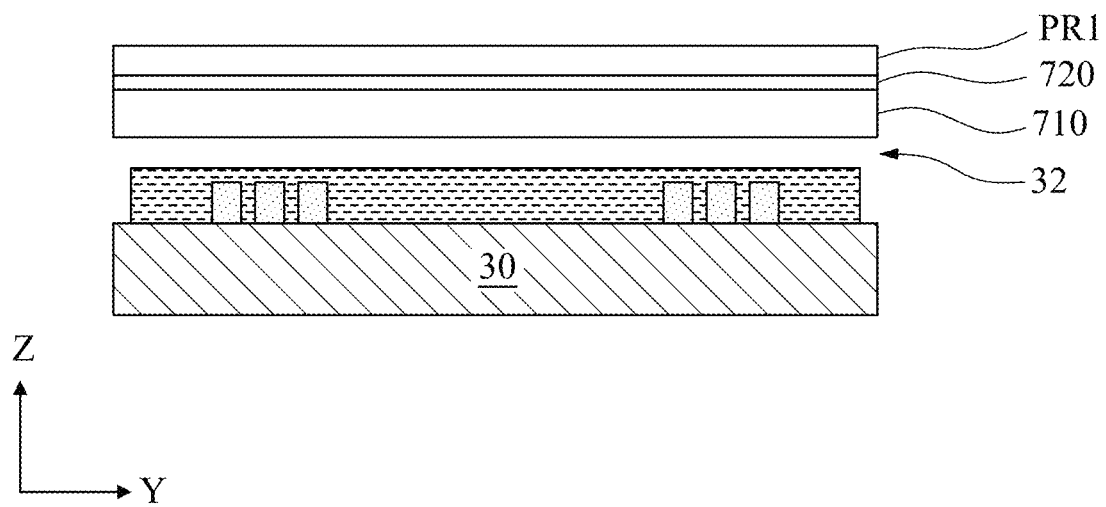
Fig. 8B1

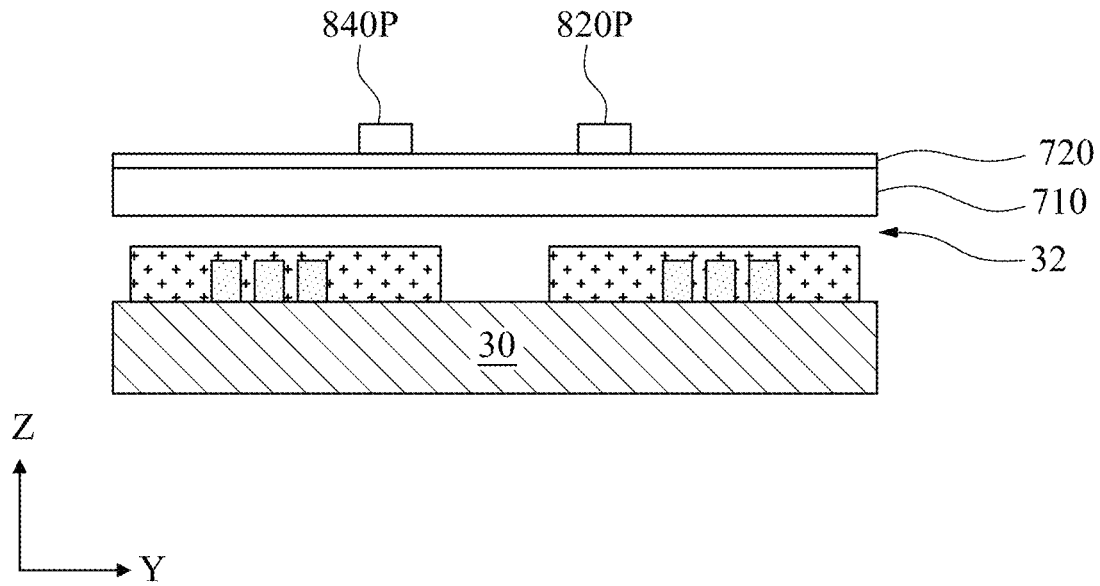
Fig. 8A2
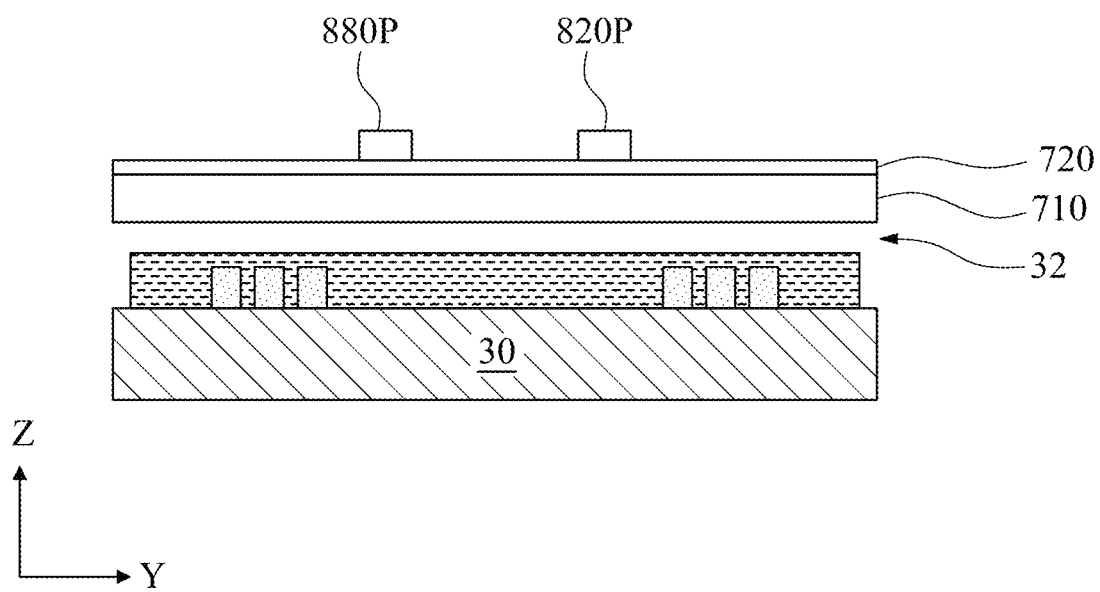
Fig. 8B2

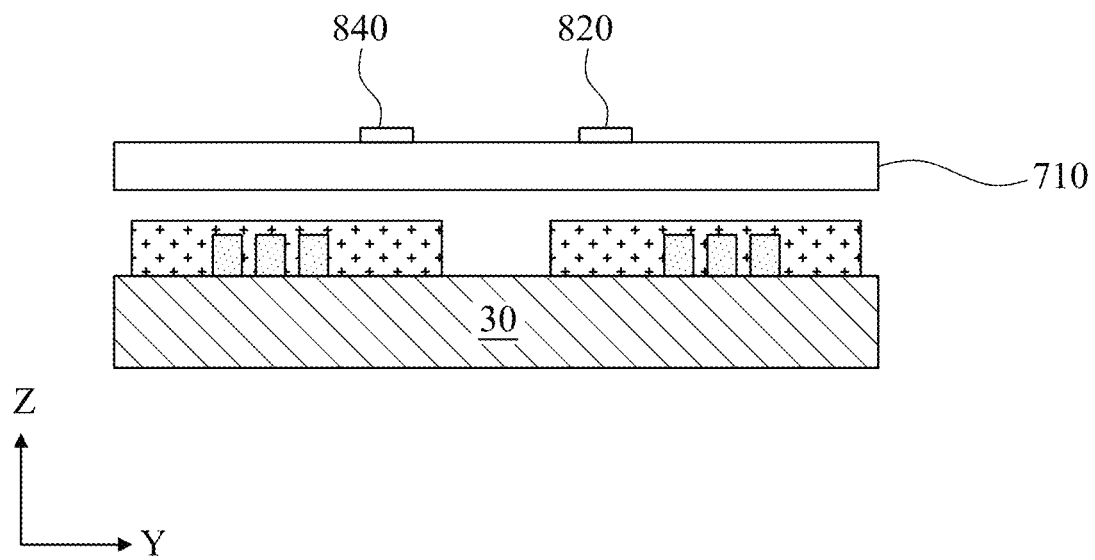
Fig. 8A3
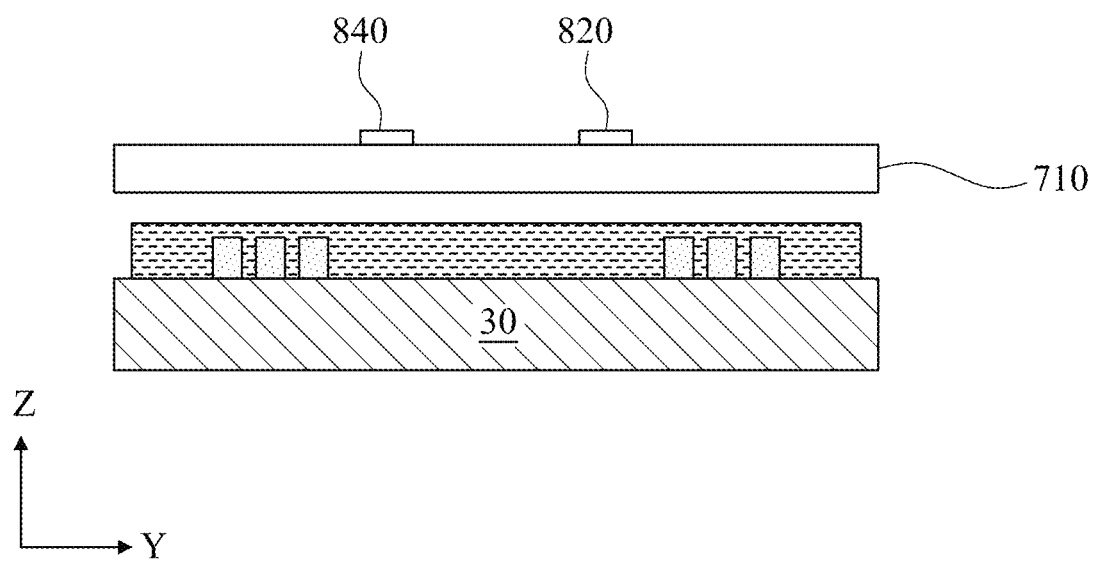
Fig. 8B3

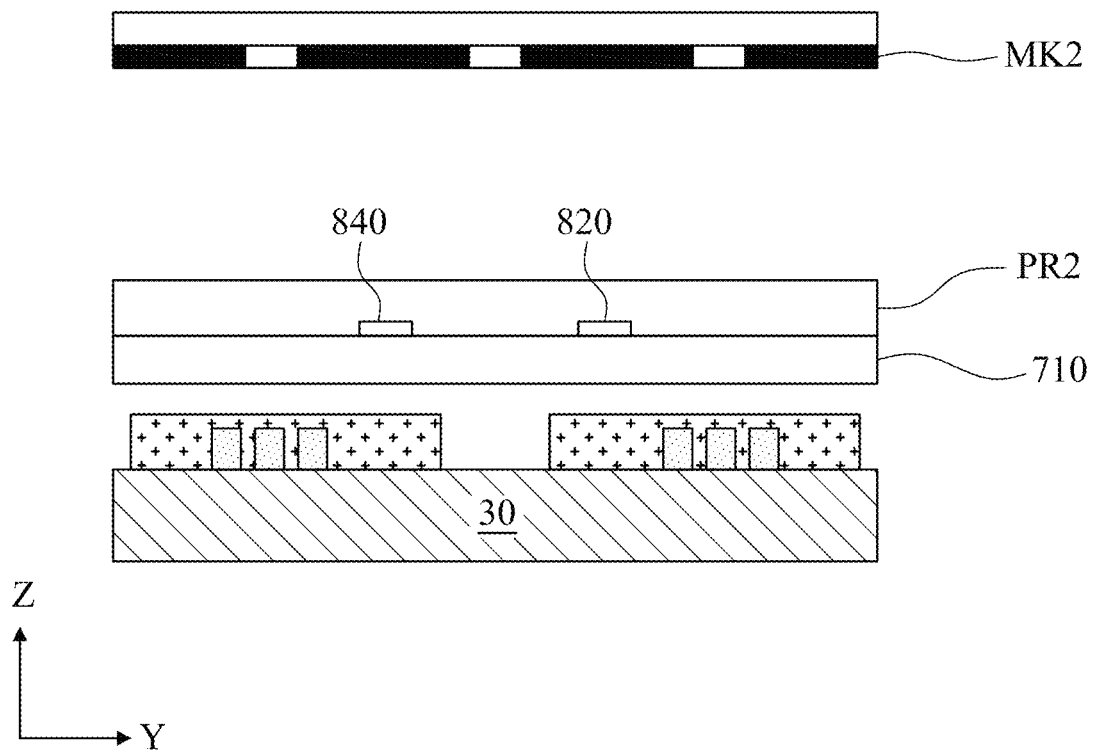
Fig. 8A4
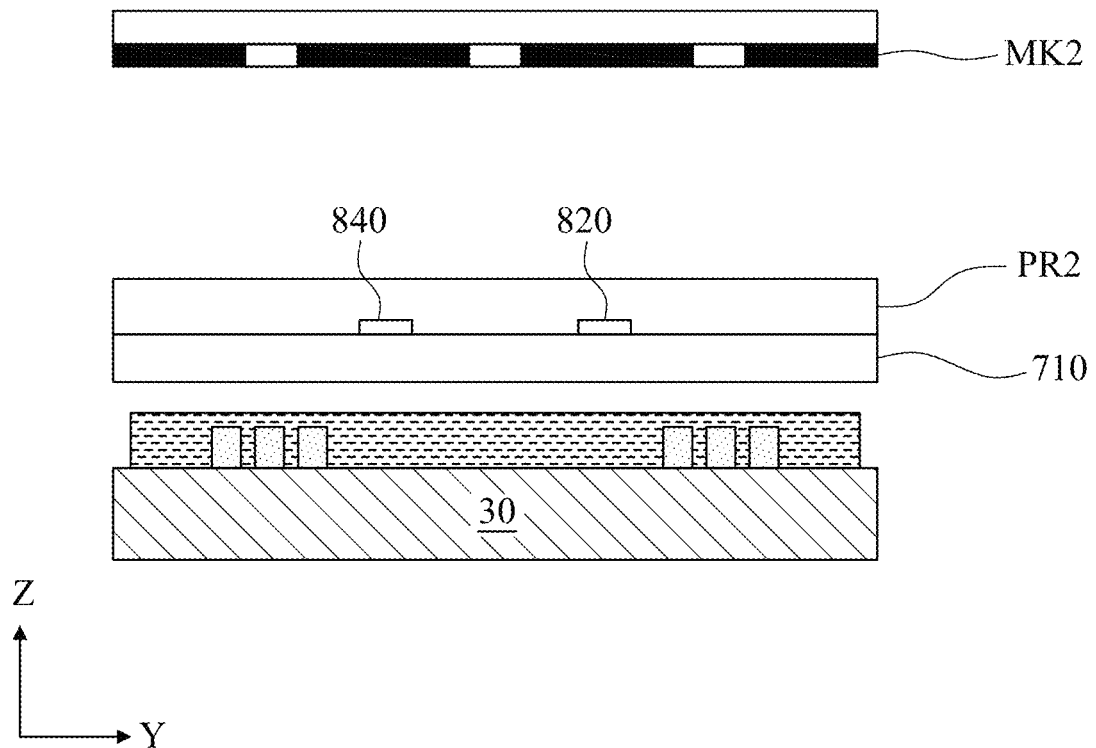
Fig. 8B4

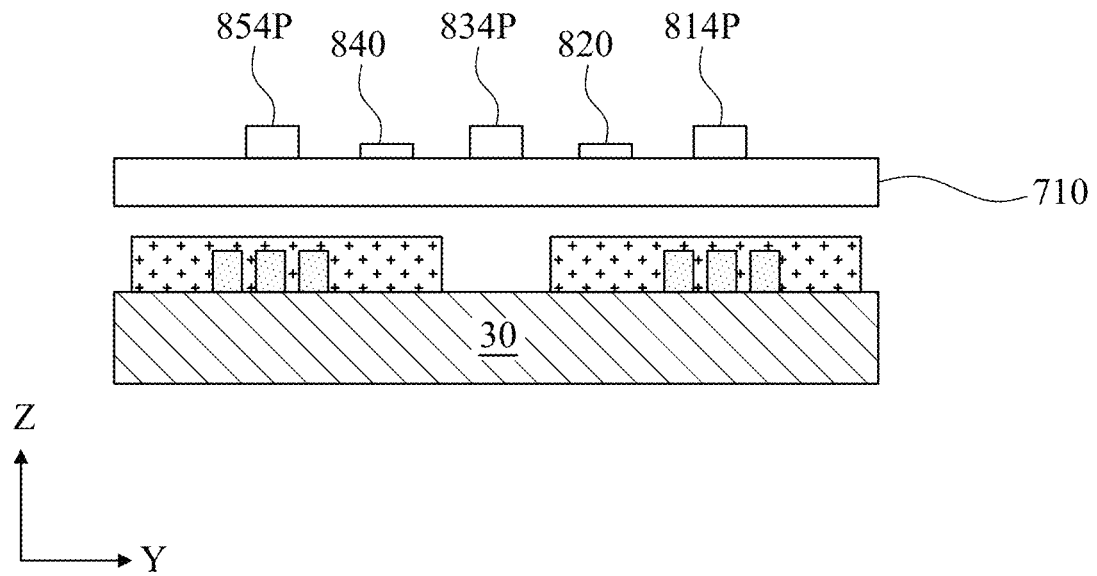
Fig. 8A5
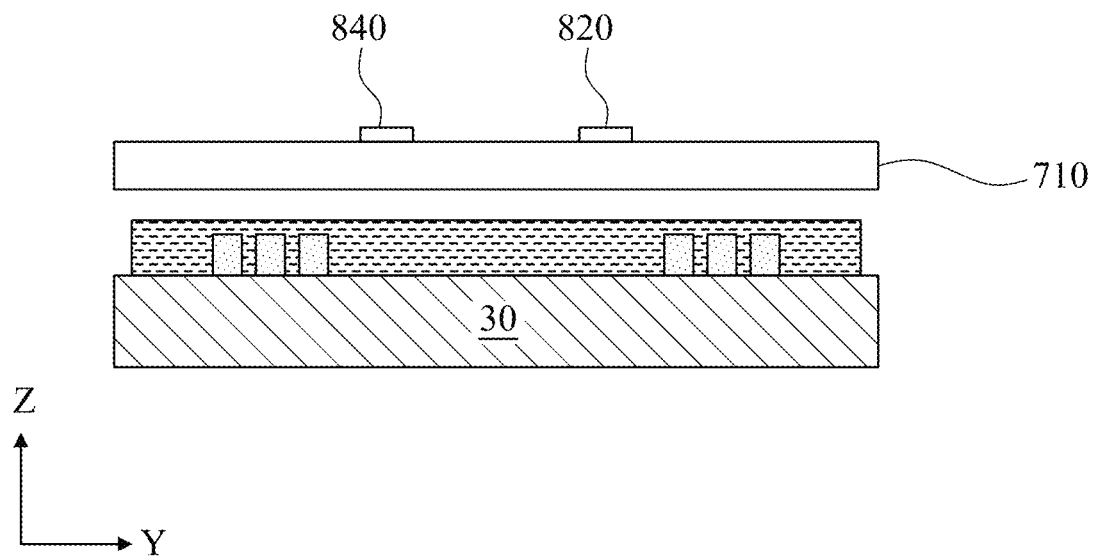
Fig. 8B5

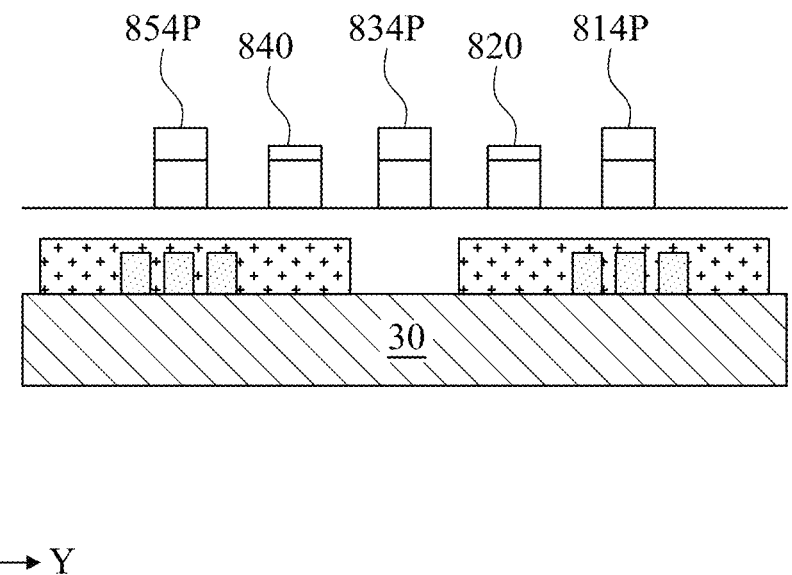
Fig. 8A6
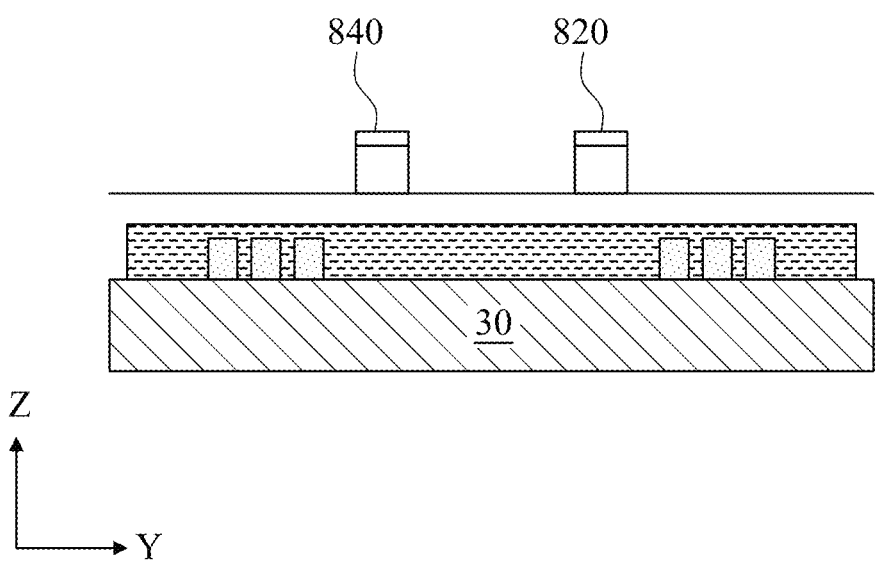
Fig. 8B6

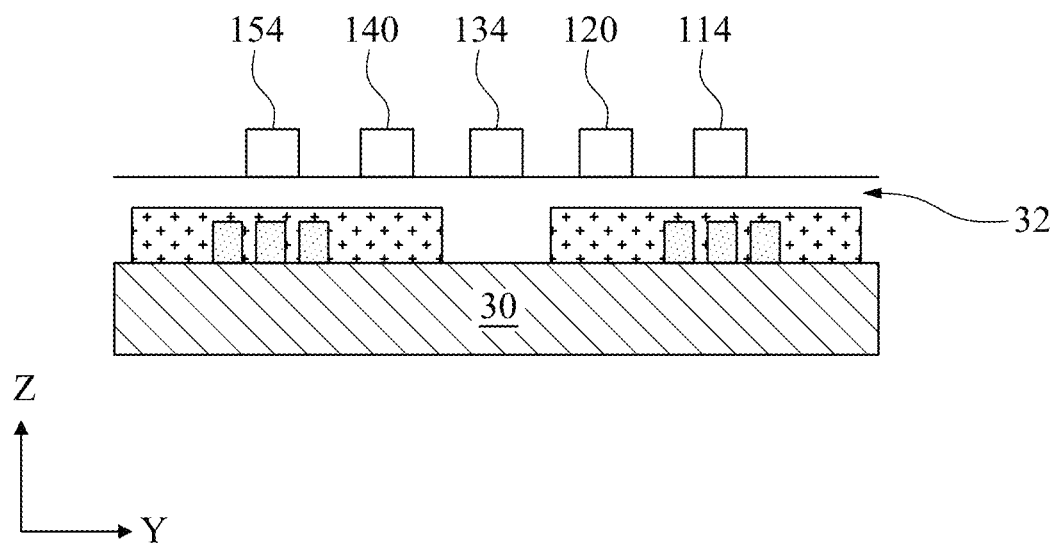
Fig. 8A7
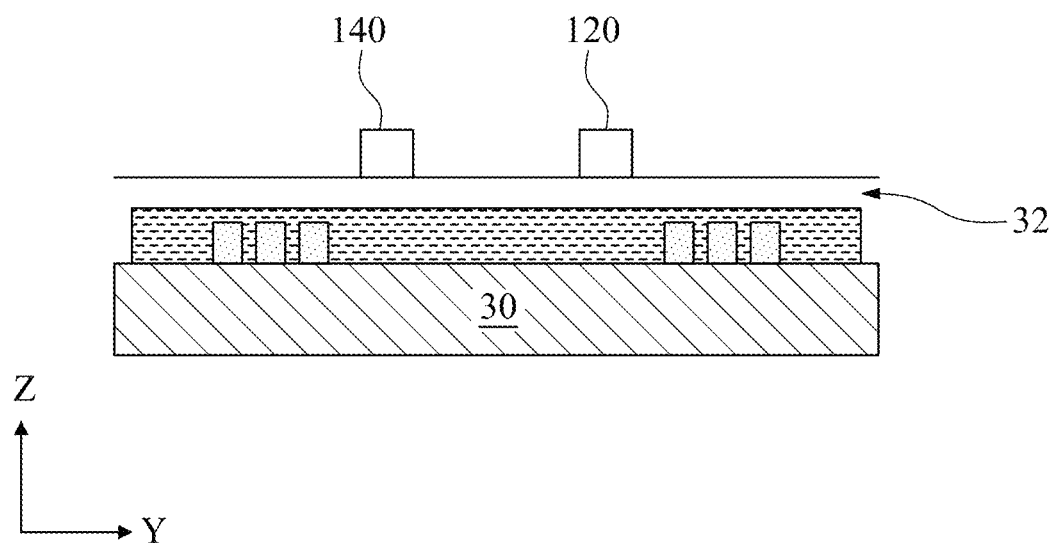
Fig. 8B7

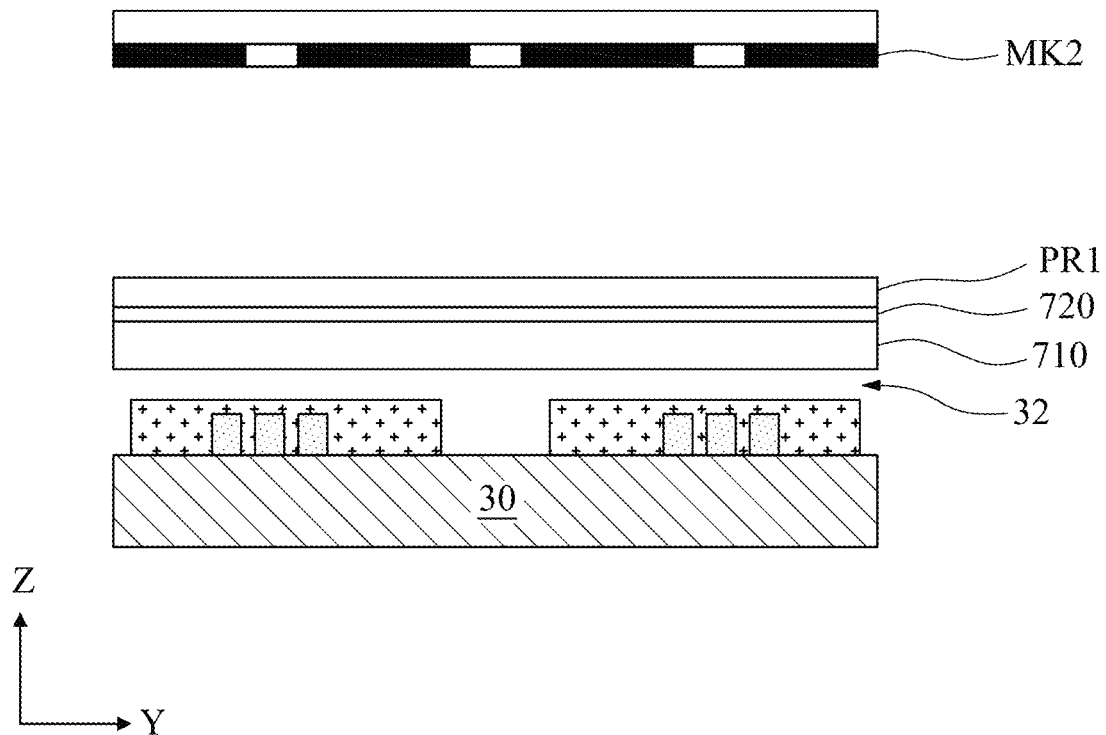
Fig. 9A1
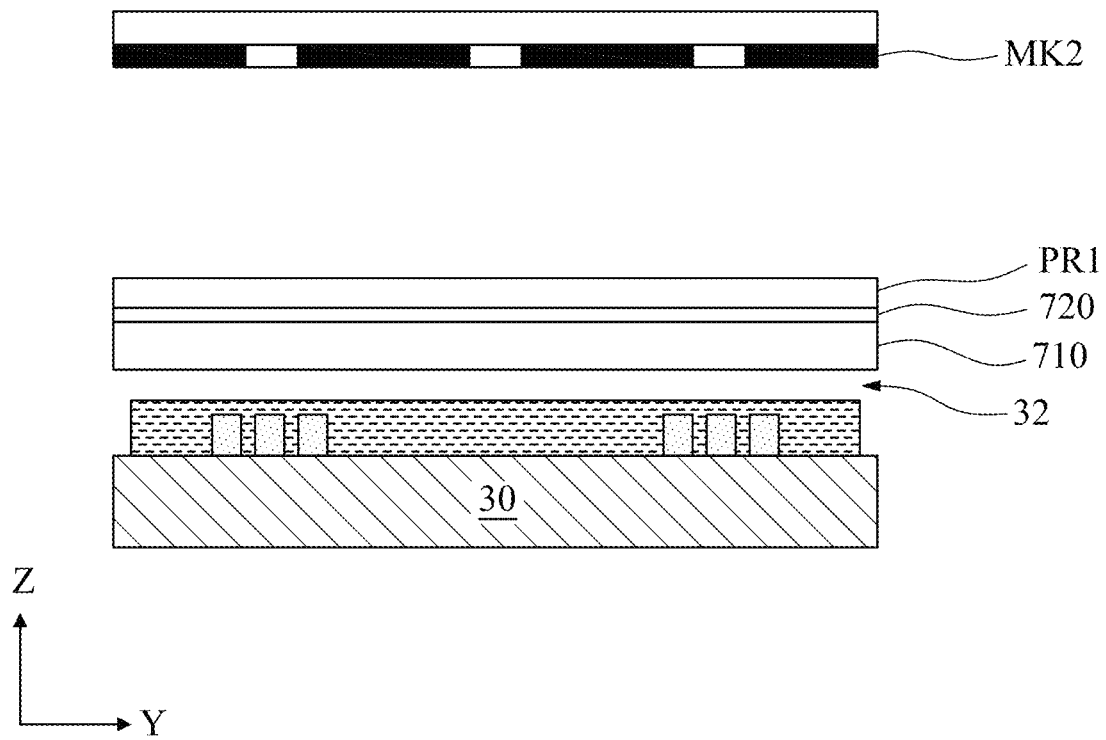
Fig. 9B1

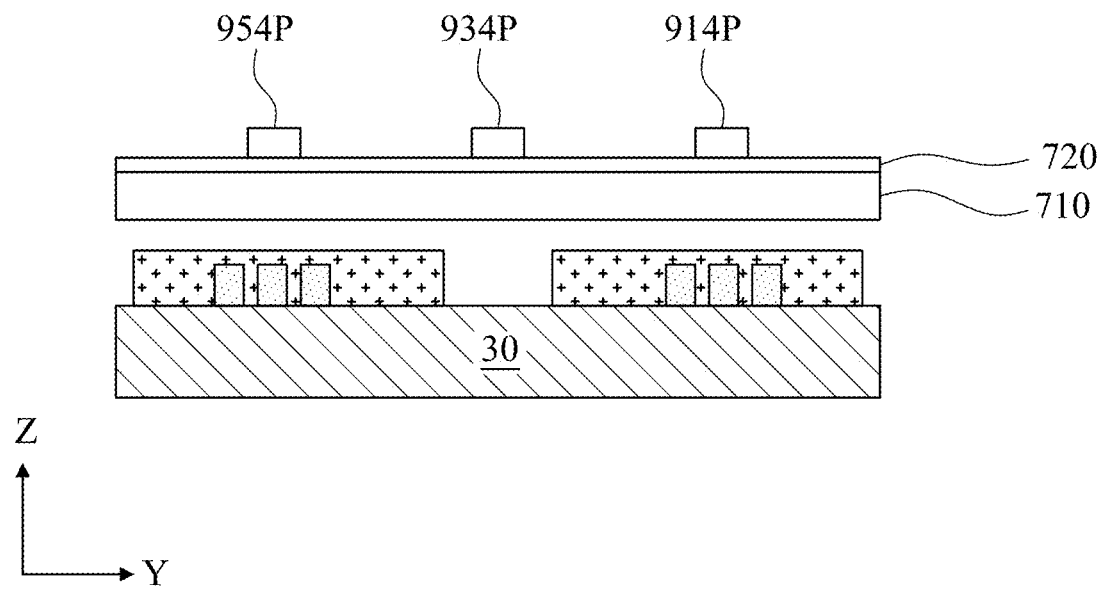
Fig. 9A2
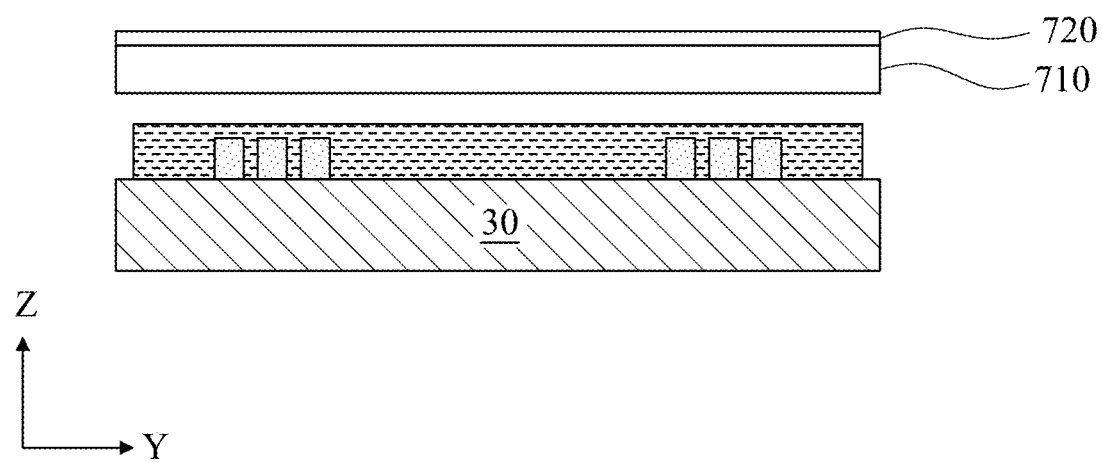
Fig. 9B2

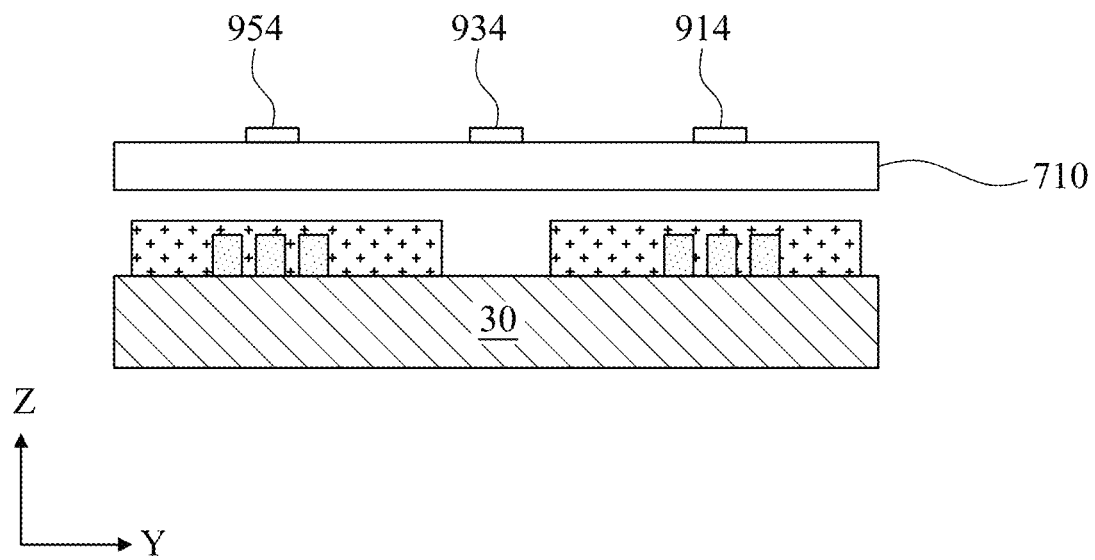
Fig. 9A3
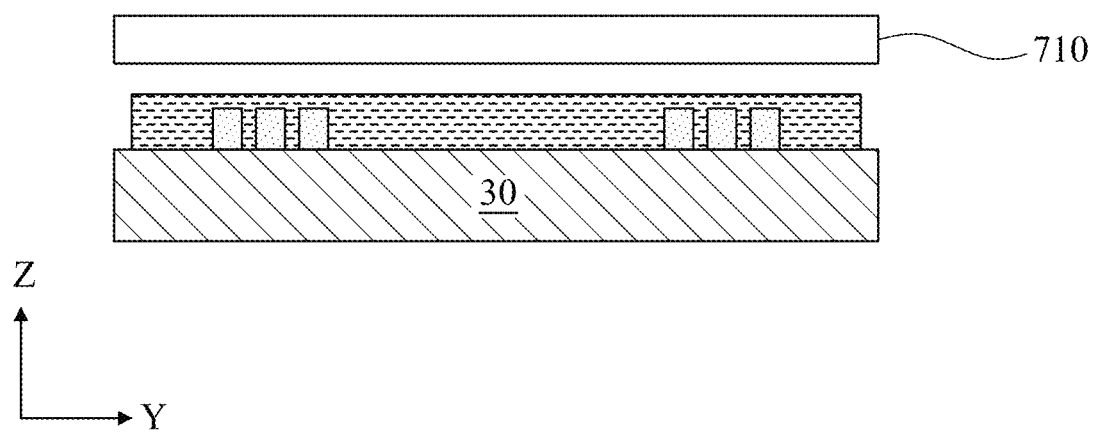
Fig. 9B3

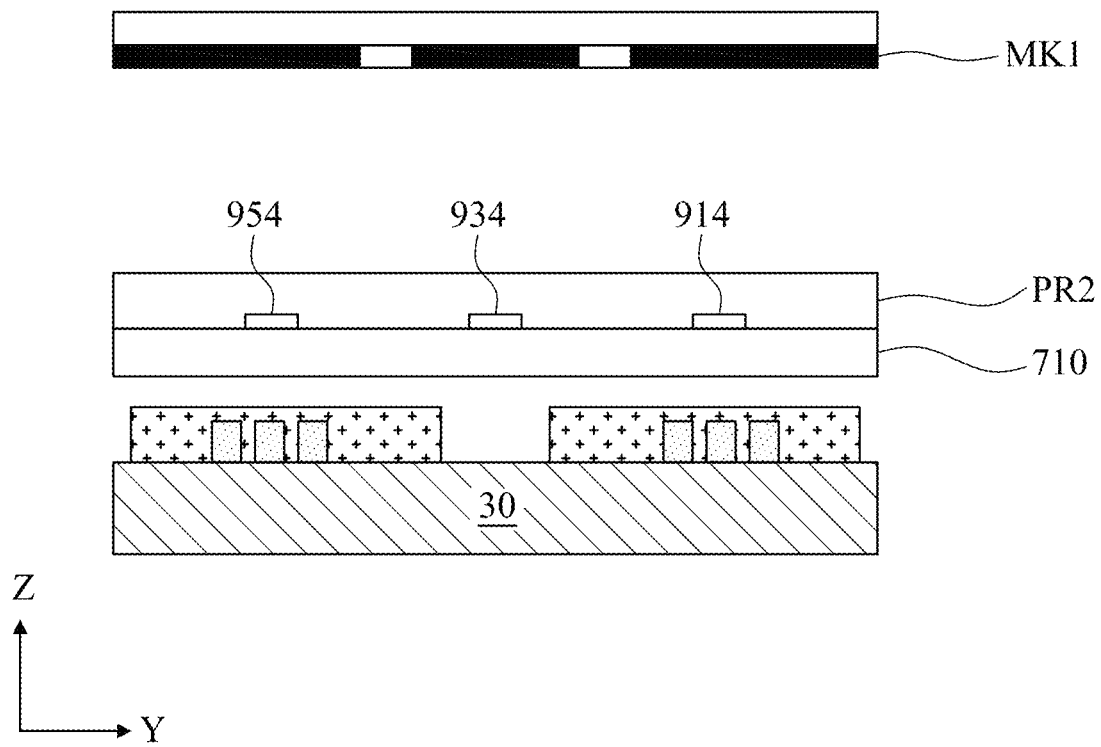
Fig. 9A4
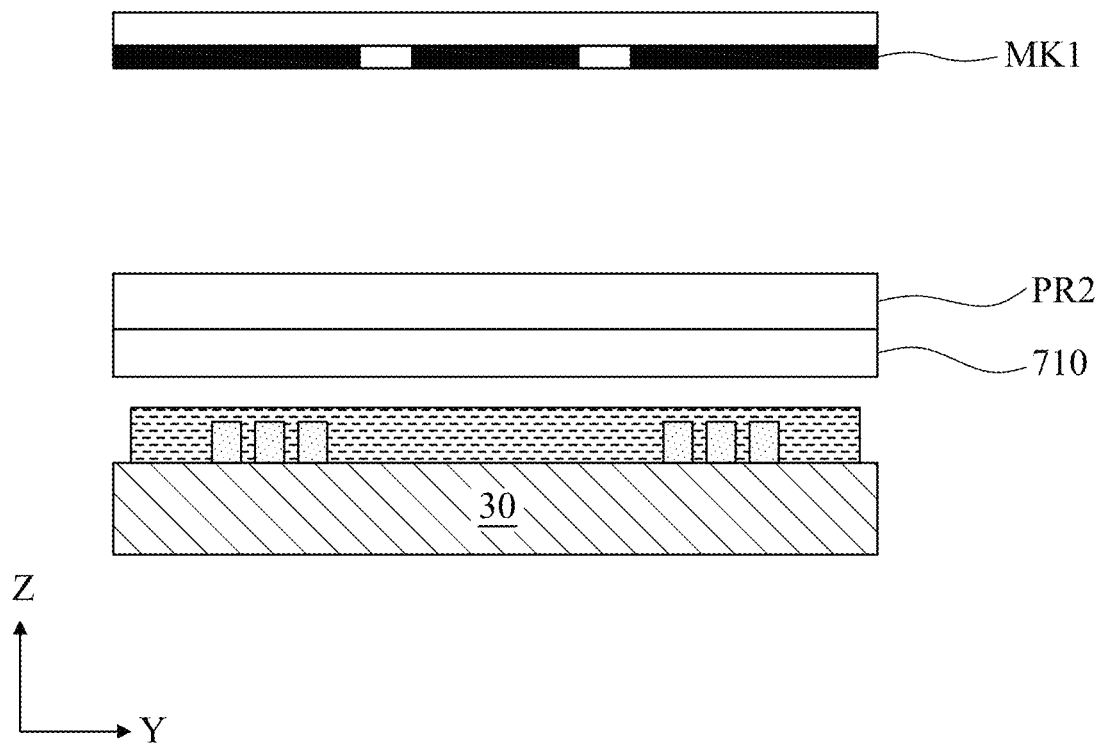
Fig. 9B4

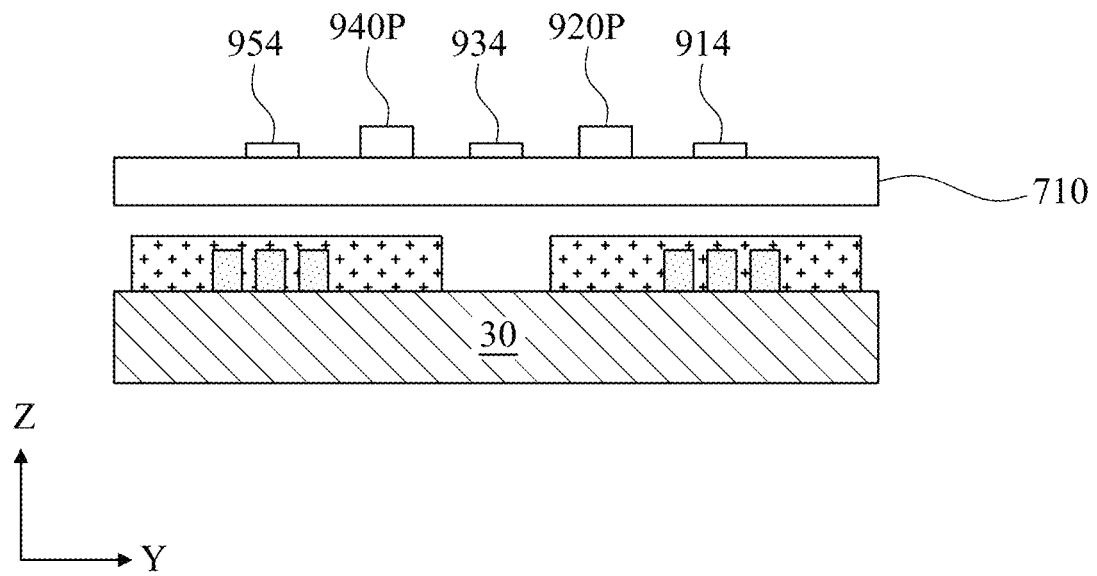
Fig. 9A5
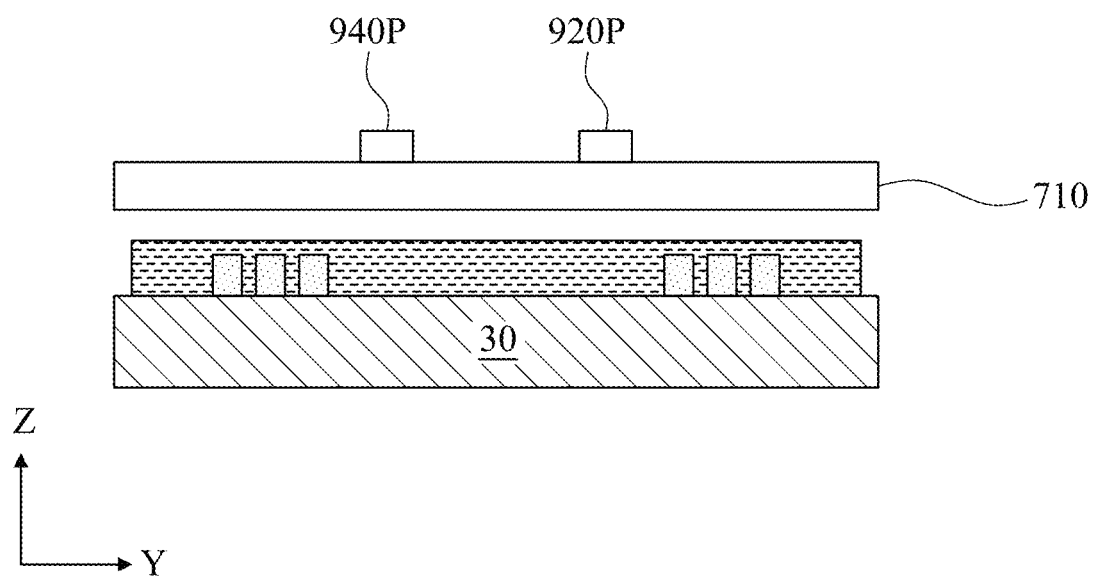
Fig. 9B5

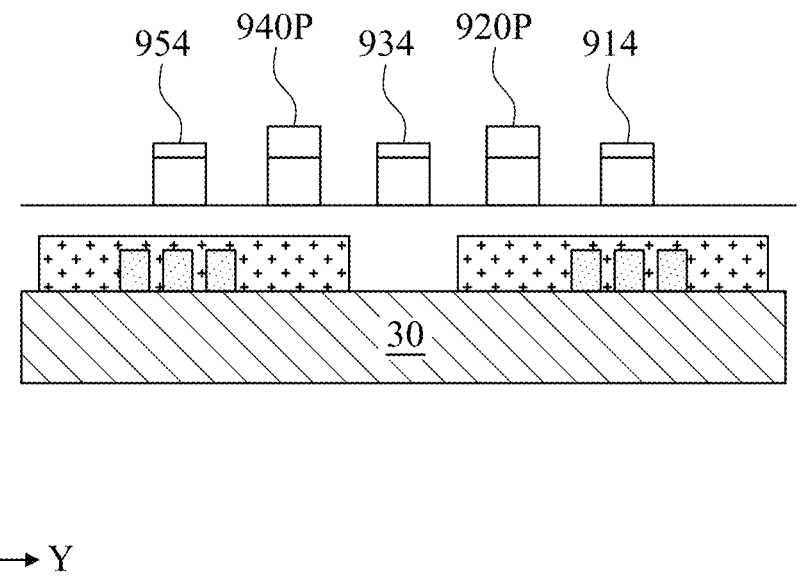
Fig. 9A6
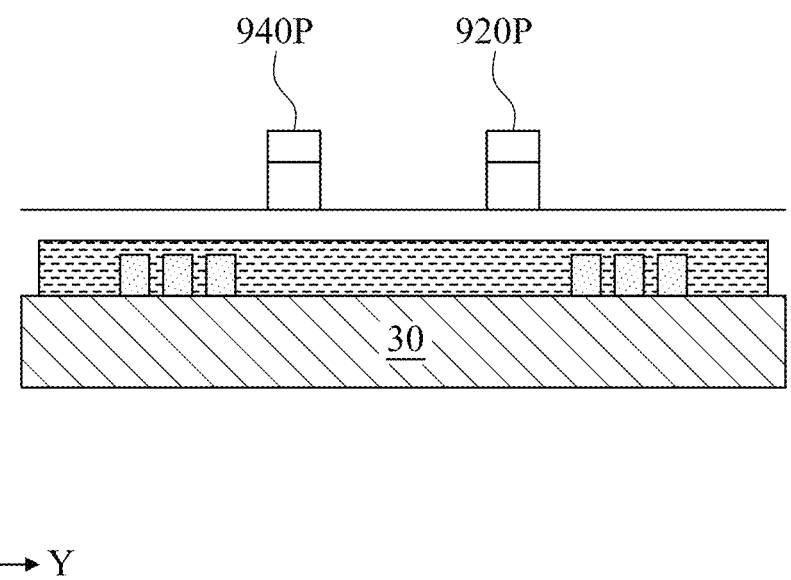
Fig. 9B6

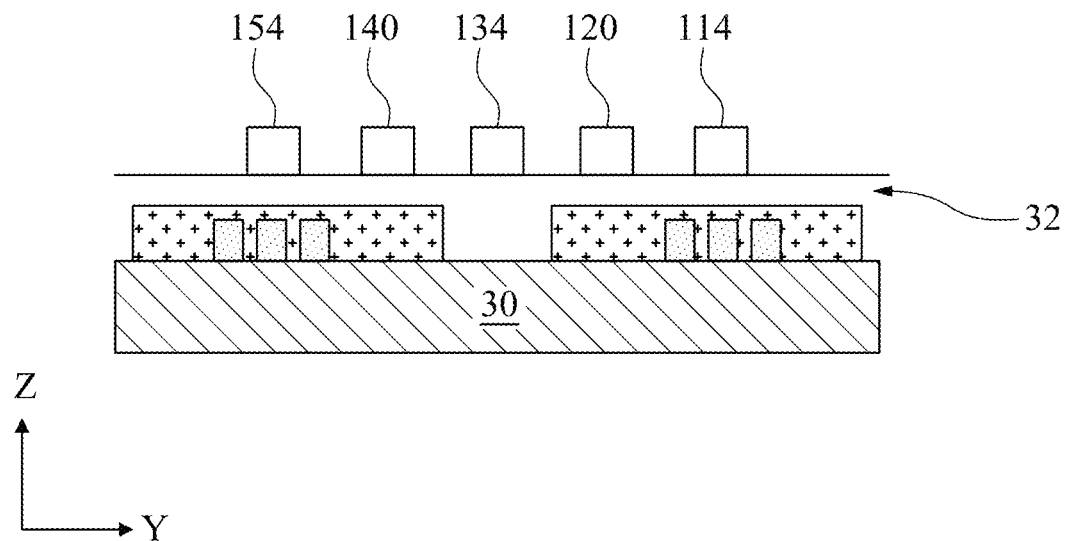
Fig. 9A7
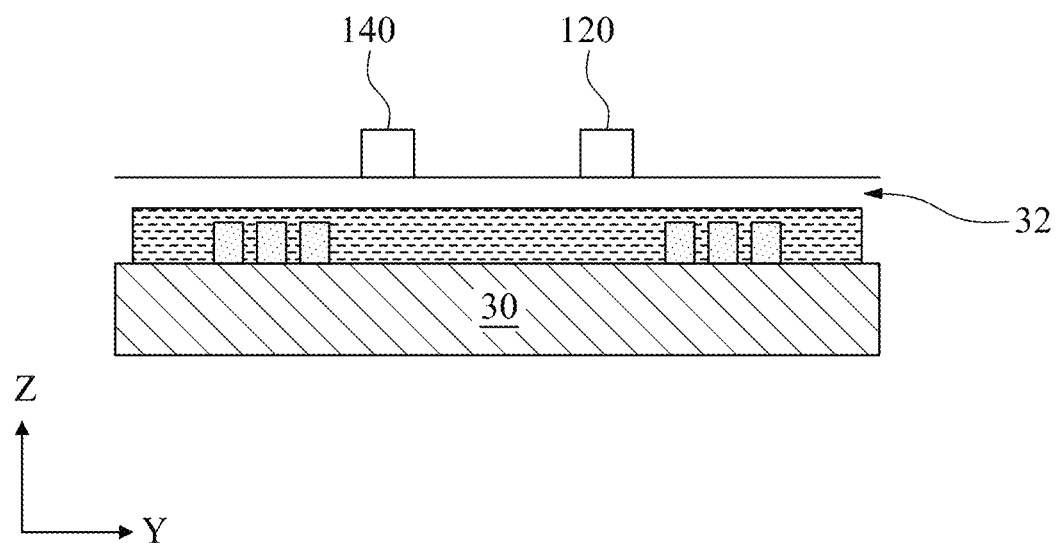
Fig. 9B7

INTEGRATED CIRCUITS HAVING SIGNAL LINES FORMED WITH DOUBLE PATTERNING

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6B are layout diagrams of MOM capacitors implemented with metal conducting lines identified with the same layout color, in accordance with some embodiments.

FIG. 8A1/FIG. 8B1 to FIG. 8A7/FIG. 8B7 are cross-sectional views of device structures during the fabrication of the integrated circuits in FIG. 1 using the method of FIG. 10A or FIG. 10B, in accordance with some embodiments.

FIG. 9A1/FIG. 9B1 to FIG. 9A7/FIG. 9B7 are cross-sectional views of device structures during the fabrication of the integrated circuits in FIG. 1 using the method of FIG. 10A or FIG. 10B, in accordance with some embodiments.

DETAILED DESCRIPTION

Figure 1:
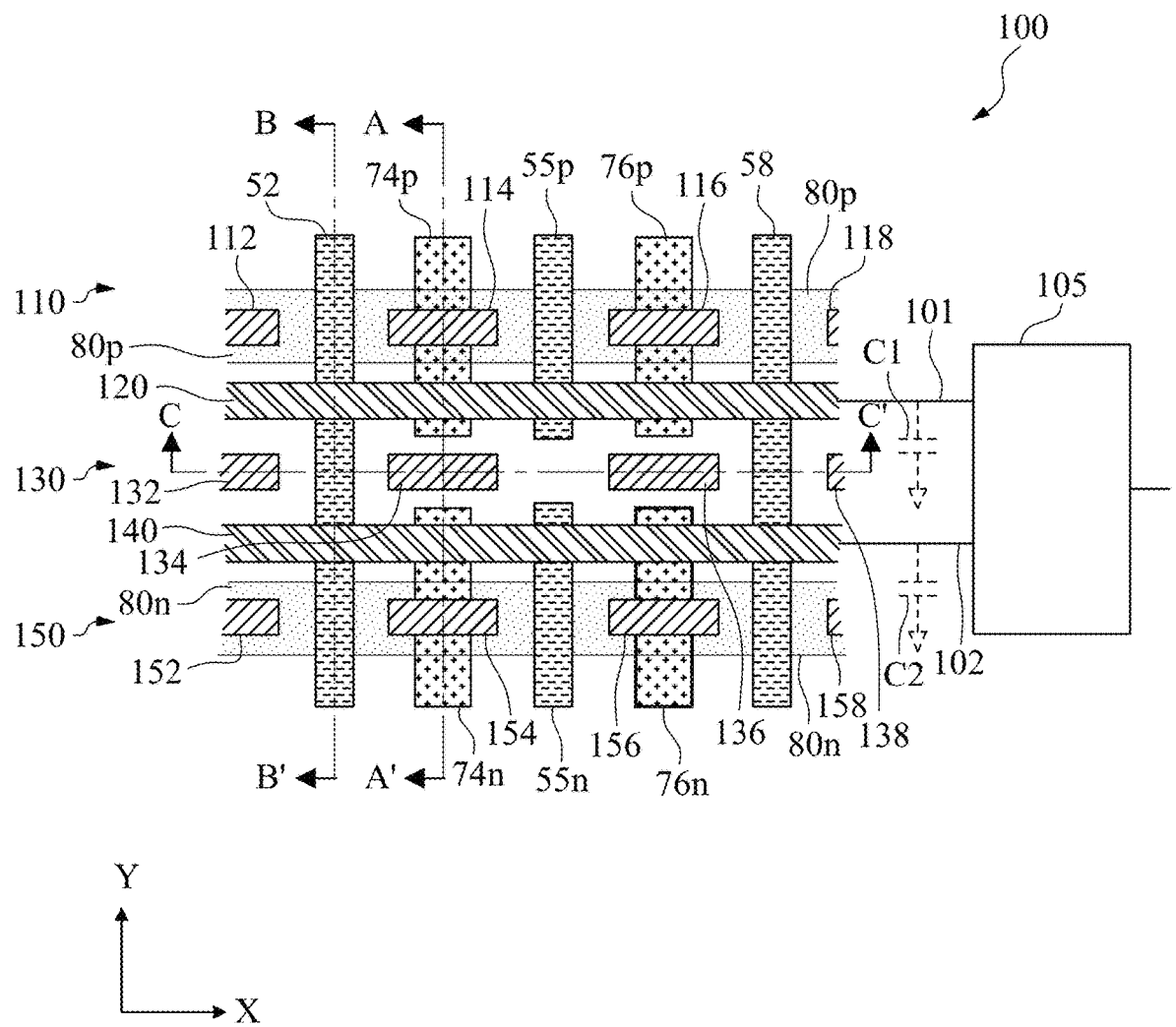
FIG. 1 is a layout diagram of an integrated circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit includes metal conducting lines and metal segments fabricated in a same metal layer with a double patterning process. Multiple metal segments formed between two metal conducting lines are dummy conductors, and the two metal conducting lines on either side of the dummy conductors are implemented as matched signal lines. When the metal conducting lines are formed according to a first photolithography mask and the metal segments are formed according to a second photolithography mask, the two metal conducting lines are more reliably formed as two matched signal lines, as compared with some alternative implementations in which the two metal conducting lines are defined with different photolithography masks. In some embodiments, when the dummy conductors are connected to a signal ground, the dummy conductors form a shield that reduces stray capacitive couplings between the matched signal lines.

FIG. 1 is a layout diagram of an integrated circuit 100, in accordance with some embodiments. The layout diagram of FIG. 1 includes the layout patterns extending in the X-direction for specifying active-region structures (80p and 80n) and the layout patterns extending in the Y-direction for specifying gate-conductors (52, 55p, 55n, and 58) and terminal-conductor lines (74p, 74n, 76p, and 76n). The Y-direction is perpendicular to the X-direction. The layout diagram of FIG. 1 also includes the layout patterns extending in the X-direction for specifying metal conducting lines (120 and 140) and metal segment lineups (110, 130, and 150). The metal segment lineup 110 includes multiple metal segments 112, 114, 116, and 118, the metal segment lineup 130 includes multiple metal segments 132, 134, 136, and 138, and the metal segment lineup 150 includes multiple metal segments 152, 154, 156, and 158.

In the integrated circuit 100 as specified by the layout diagram of FIG. 1, each of the gate-conductors 52 and 58 intersects the active-region structure 80p at the channel region of a PMOS transistor and intersects the active-region structure 80n at the channel region of an NMOS transistor. The gate-conductors 55p and 55n correspondingly intersect the active-region structure 80p at the channel region of a PMOS transistor and intersect the active-region structure 80n at the channel region of an NMOS transistor. The terminal-conductor lines 74p and 76p intersect the active-region structure 80p at various source/drain regions of the PMOS transistors formed with the active-region structure 80p. The terminal-conductor lines 74n and 76n intersect the active-region structure 80n at various source/drain regions of the NMOS transistors formed with the active-region structure 80n.

In some embodiments, when the active-region structures 80p and 80n are formed with fin structures, the transistors formed with the active-region structures 80p and 80n are FinFETs. In some embodiments, when the active-region structures 80p and 80n are formed with nano-sheet structures, the transistors formed with the active-region structures 80p and 80n are nano-sheet transistors. In some embodiments, when the active-region structures 80p and 80n are formed with nano-wire structures, the transistors formed with the active-region structures 80p and 80n are nano-wire transistors.

The active-region structures (80p and 80n), the gate-conductors (52, 55p, 55n, and 58), and terminal-conductor lines (74p, 74n, 76p, and 76n) are all fabricated in the front-end-of-line (FEOL) process. The metal conducting lines (120 and 140) and the metal segment lineups (110, 130, and 150); however, are fabricated in a metal layer during the back-end-of-line (BEOL) process with a double patterning technique. The double patterning technique involves at least two photolithography masks, and each of the photolithography mask is used in an exposure during one of the photolithography processes. In some embodiments, after a metal layer is deposited, the patterning for forming the metal conducting lines (120 and 140) in the metal layer is created with a first photolithography mask, and the patterning for forming the metal segment lineups (110, 130, and 150) in the metal layer is created with a second photolithography mask. Example processes of fabricating the metal conducting lines (120 and 140) and metal segment lineups (110, 130, and 150) with a double patterning technique are explained in more details with respect to figures from FIG. 8A1/FIG. 8B1-FIG. 8A7/FIG. 8B7 and from FIG. 9A1/FIG. 9B1-FIG. 9A7/FIG. 9B7.

In some embodiments, the metal conducting lines (120 and 140) and the metal segment lineups (110, 130, and 150) are formed in the first metal layer M0 above the top insulation layer fabricated in the front-end-of-line (FEOL) process. In some embodiments, the metal conducting lines (120 and 140) and the metal segment lineups (110, 130, and 150) are formed in the second metal layer M1 overlying an interlayer dielectric above the first metal layer M0.

Figure 2A:
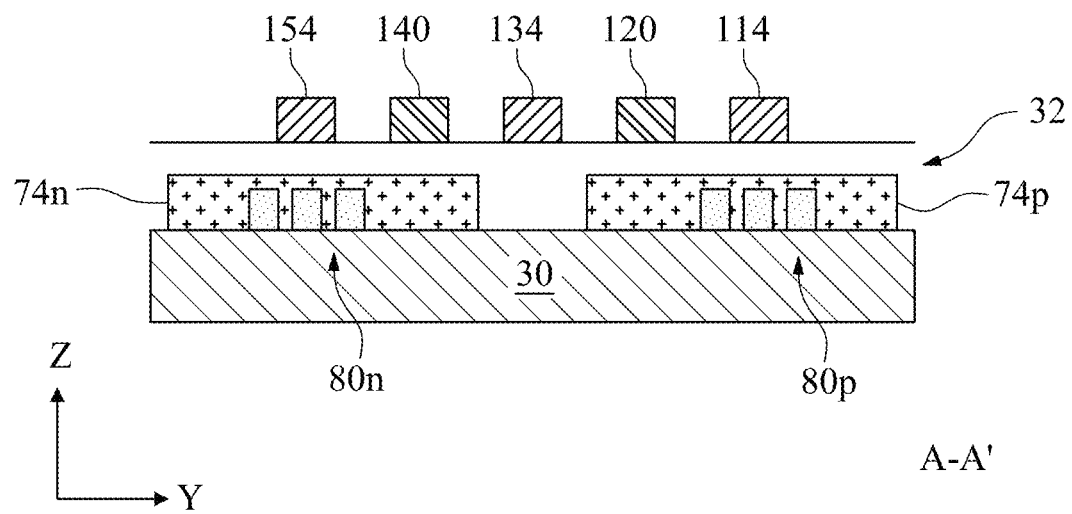
FIG. 2A is a cross-sectional view of the integrated circuit as specified by the layout diagram of FIG. 1 in a cutting plane A-A', in accordance with some embodiments.

FIG. 2A is a cross-sectional view of the integrated circuit 100 as specified by the layout diagram of FIG. 1 in a cutting plane A-A', in accordance with some embodiments. In FIG. 2A, the terminal-conductor line 74p intersects the active-region structure 80p on the substrate 30, and the terminal-conductor line 74n intersects the active-region structure 80n on the substrate 30. The insulation layer 32 covers the terminal-conductor lines 74p and 74n. The metal conducting lines 120 and 140 and the metal segments 114, 134, and 154 are in the first metal layer overlying the insulation layer 32.

Figure 2B:
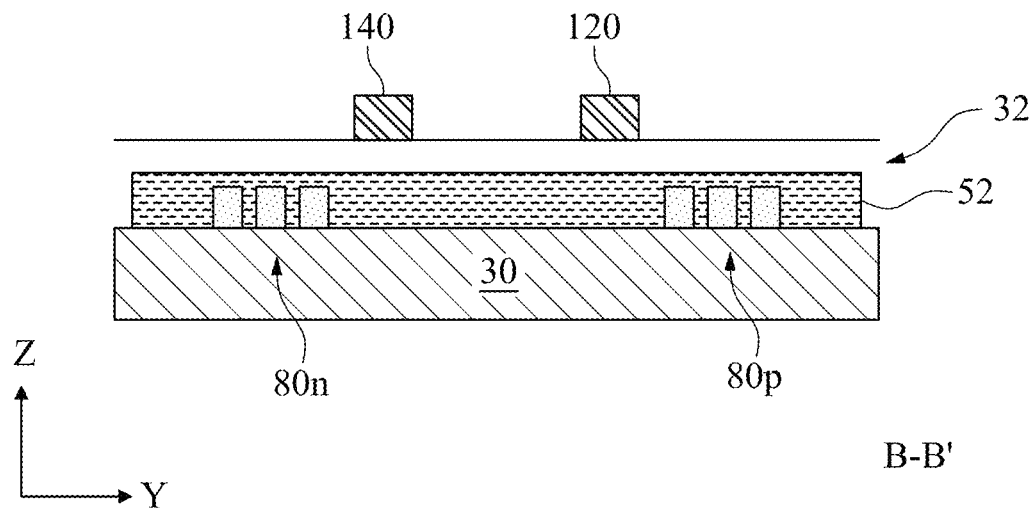
FIG. 2B is a cross-sectional view of the integrated circuit as specified by the layout diagram of FIG. 1 in a cutting plane B-B', in accordance with some embodiments.

FIG. 2B is a cross-sectional view of the integrated circuit 100 as specified by the layout diagram of FIG. 1 in a cutting plane B-B', in accordance with some embodiments. In FIG. 2B, the gate-conductor 52 intersects the active-region structure 80p and the active-region structure 80n on the substrate 30. The insulation layer 32 covers the gate-conductor 52. The metal conducting lines 120 and 140 are in the first metal layer overlying the insulation layer 32.

Figure 2C:
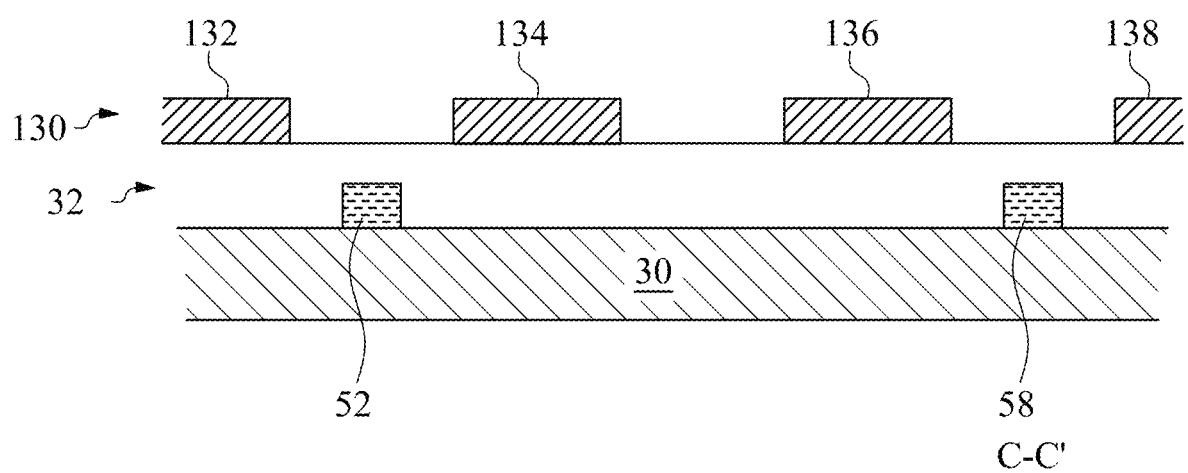
FIG. 2C is a cross-sectional view of the integrated circuit as specified by the layout diagram of FIG. 1 in a cutting plane C-C', in accordance with some embodiments.

FIG. 2C is a cross-sectional view of the integrated circuit 100 as specified by the layout diagram of FIG. 1 in a cutting plane C-C', in accordance with some embodiments. In FIG. 2C, the gate-conductors 52 and 58 on the substrate 30 are covered by the insulation layer 32. The metal segments 132, 134, 136, and 138 in the metal segment lineup 130 are in the first metal layer overlying the insulation layer 32.

In the integrated circuit 100 as specified by the layout diagram of FIG. 1, the metal conducting lines 120 and 140 are implemented as matched signal lines. When implemented as matched signal lines, the width of the metal conducting line 120 is equal to the width of the metal conducting line 140. In one example application of the matched signal lines, an electric circuit 105 having a first input 101 and a second input 102 is shown schematically in FIG. 1, along with the layout diagram of the integrated circuit 100. The metal conducting line 120 is connected to the first input 101, and the metal conducting line 140 is connected to the second input 102. A first capacitive value C1 of the first input 101 relative to a signal ground is equal to a second capacitive value C2 of the second input 102 relative to the signal ground.

In some embodiments, the electric circuit 105 is a receiving device that receives signals from a transmitting device, and the metal conducting lines 120 and 140 correspondingly connect the first input 101 and the second input 102 with the outputs of the transmitting device (not shown in the figure). In some embodiments, the metal conducting line 120 is electrically coupled between the first input 101 and a first output of the transmitting device through two via connectors, and the distance between the two via connectors is the length of the metal conducting line 120. The metal conducting line 140 is electrically coupled between the second input 102 and a second output of the transmitting device through two via connectors, and the distance between the two via connectors is the length of the metal conducting line 140. The length of the metal conducting line 120 is equal to the length of the metal conducting line 140.

In some embodiments, the electric circuit 105 is a differential amplifier, while the first input 101 is an inverting input and the first input 101 is non-inverting input. In some embodiments, the electric circuit 105 is a clock synchronized circuit, while the first input 101 receives a synchronization clock signal and the second input 102 receives an inverted synchronization clock signal which is 180 degrees out of phase with the synchronization clock signal. In some embodiments, the electric circuit 105 is a phase sensitive circuit, while the first input 101 receives an in-phase signal and the second input 102 receives a quadrature-phase signal which is 90 degrees out of phase with the in-phase signal. In some embodiments, the performance of the electric circuit 105 is improved with an implementation in which the metal conducting lines 120 and 140 are matched signal lines, as compared with an alternative implementation in which the metal conducting lines 120 and 140 are not matched.

When the metal conducting lines 120 and 140 are defined by the same mask during the double patterning process, the metal conducting lines 120 and 140 are more reliably formed as matched signal lines, as compared with some alternative implementations in which the two signal conducting lines connected to the first input 101 and the second input 102 of the electric circuit 105 are defined with different masks.

In some embodiments, the metal conducting lines and the metal segment lineups are all fabricated in alignment with one of the horizontal line tracks. In some implementations of layout diagrams, when the horizontal line tracks are identified with track numbers that are sequentially numbered from one horizontal boundary to another horizontal boundary of a cell, any metal conducting line or metal segment fabricated in alignment with an even track number are identified with a first layout color, and any metal conducting line or metal segment fabricated in alignment with an odd track number are identified with a second layout color. Based on the layout diagram for the "two-color" process, metal conducting lines and/or metal segments identified with the first layout color are defined with a first mask during the double patterning process, while metal conducting lines and/or metal segments identified with the second layout color are defined with a second mask during the double patterning process.

In one example implementation, using FIG. 1 as an example, the metal conducting line 120 in "track 2" and the metal conducting line 140 in "track 4" are identified with a first layout color. The metal segment lineup 110 in "track 1", the metal segment lineup 130 in "track 3", and the metal segment lineup 150 in "track 5" are identified with a second layout color. During the double patterning process, the metal conducting lines 120 and 140 identified with the first layout color are defined by a first mask, while the metal segment lineups 110, 130, and 150 identified with the second layout color are defined by a second mask. During the double patterning process, forming two matched metal conducting lines identified with the same layout color is easier than forming two matched metal conducting lines identified with different layout colors, because two metal conducting lines identified with the same layout color are subjected to the same photolithography processes while two metal conducting lines identified with different layout colors are subjected to different photolithography processes. In some embodiments, a signal bus is implemented with two metal conducting lines identified with the same layout color. In some embodiments, a signal bus is implemented with more than two metal conducting lines identified with the same layout color.

Figure 3A:
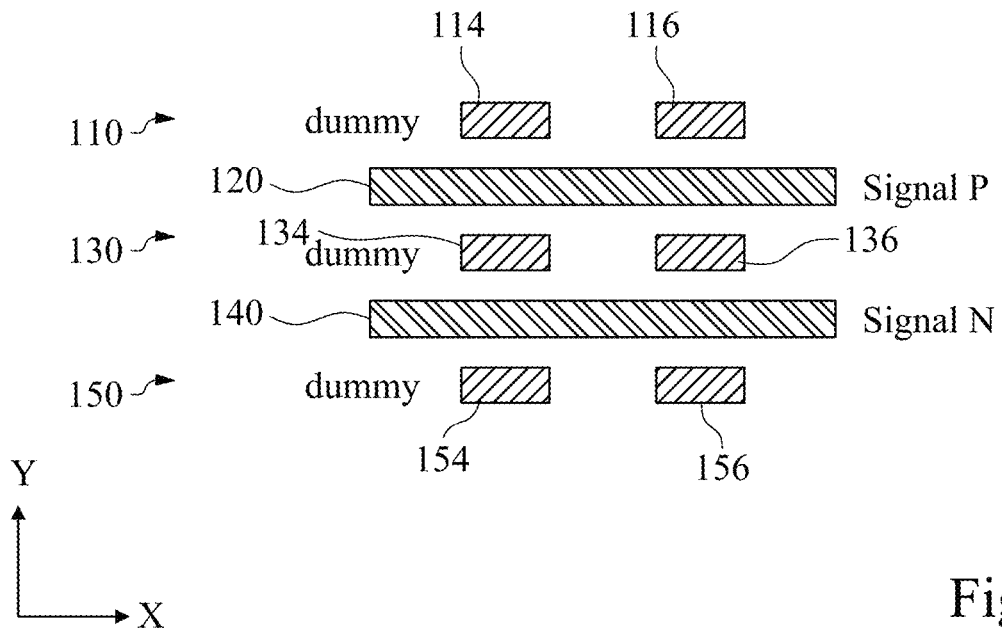
FIGS. 3A-3D and FIGS. 4A-4D are layout diagrams of signal buses implemented with metal conducting lines identified with the same layout color, in accordance with some embodiments.
Figure 3B:
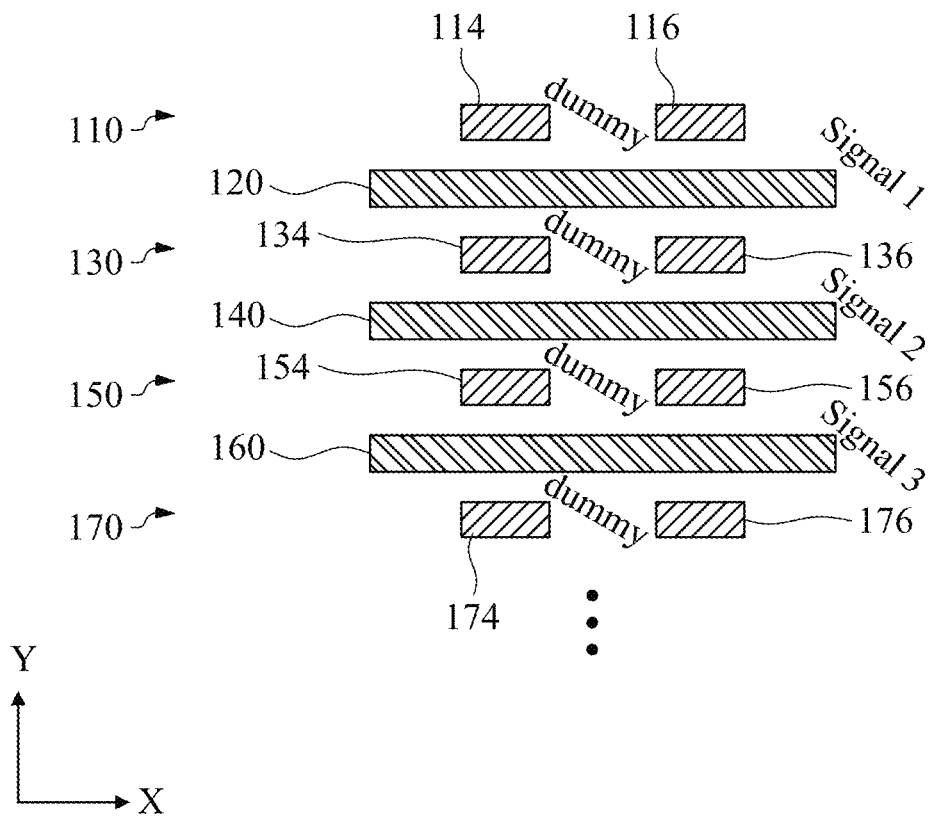
Figure 3C:
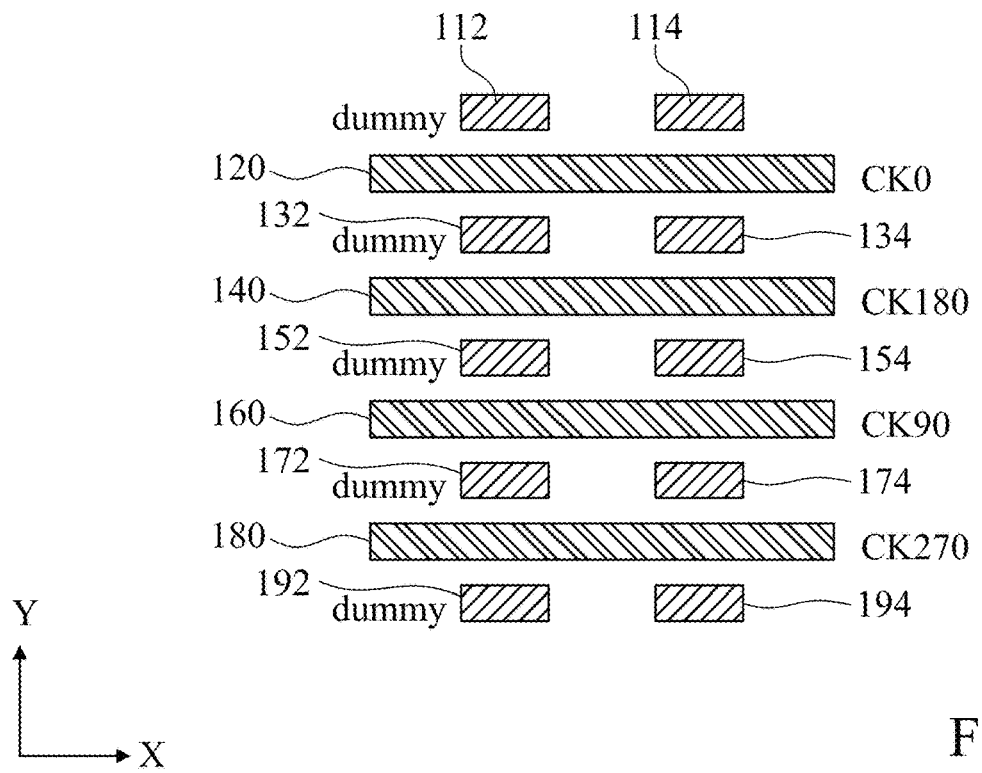
Figure 3D:
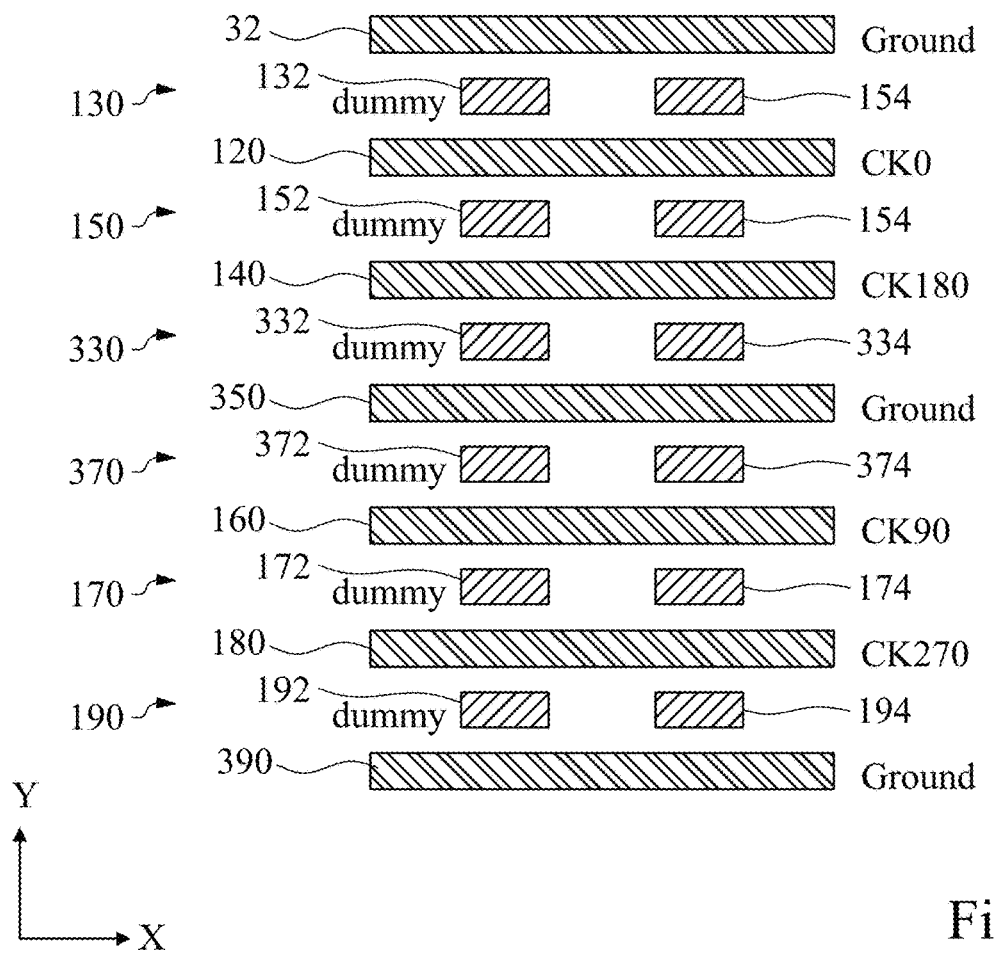
Figure 4A:
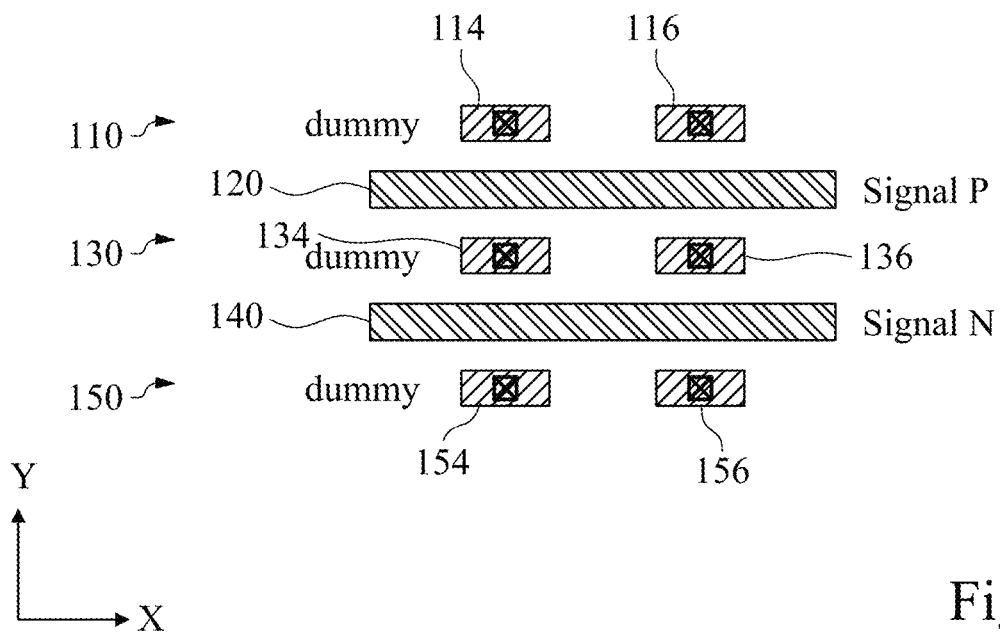

FIGS. 3A-3D and FIGS. 4A-4D are layout diagrams of signal buses implemented with metal conducting lines identified with the same layout color, in accordance with some embodiments. In FIG. 3A and FIG. 4A, a signal bus is implemented with two metal conducting lines 120 and 140 identified with the first layout color. Metal segment lineups 110, 130, and 150 identified with the second layout color are formed in the same metal layer in which the two metal conducting lines 120 and 140 are formed. Metal segment lineups 110, 130, and 150 are interlaced with the two metal conducting lines 120 and 140. In particular, the metal segment lineup 130 is between the two metal conducting lines 120 and 140, and the metal conducting line 140 is between two metal segment lineups 130 and 150. In FIG. 3A and FIG. 4A, each of the metal segment lineups includes multiple metal segments. For example, the metal segment lineup 110 includes metal segments 114 and 116, the metal segment lineup 130 includes metal segments 134 and 136, and the metal segment lineup 150 includes metal segments 154 and 156. In some embodiments, each of the metal segments is configured as a dummy conductor. In FIG. 3A, each of the metal segments is configured as a floating node. In FIG. 4A, each of the metal segments is connected to a signal ground. The metal conducting line 120 is configured to carry a Signal P, while the metal conducting line 140 is configured to carry a Signal N. When the metal segments 134 and 136 are connected to the signal ground, as shown in FIG. 4A, the cross coupling between the metal conducting lines 120 and 140 is reduced.

Figure 4B:
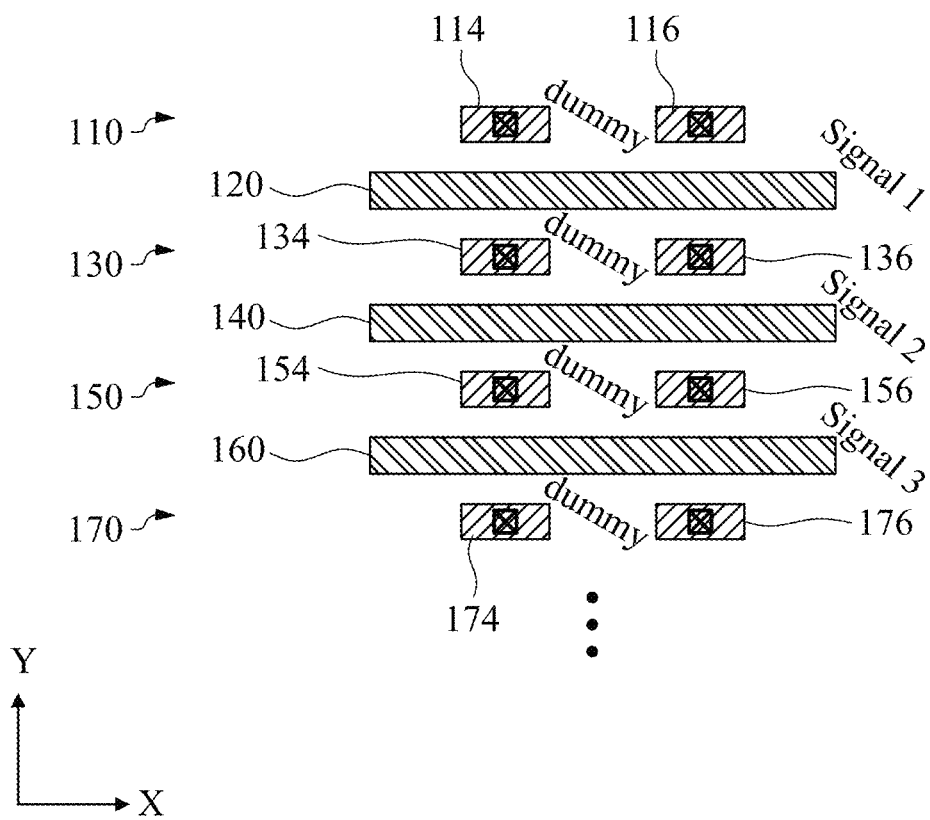

In FIG. 3B and FIG. 4B, a signal bus is implemented with three metal conducting lines 120, 140, and 160 identified with the first layout color. Metal segment lineups 110, 130, 150, and 170 identified with the second layout color are formed in the same metal layer in which the three metal conducting lines 120, 140, and 160 are formed. Metal segment lineups 110, 130, 150, and 170 are interlaced with the two metal conducting lines 120, 140, and 160. In FIG. 3B and FIG. 4B, each of the metal segment lineups includes multiple metal segments. For example, the metal segment lineup 110 includes metal segments 114 and 116, the metal segment lineup 130 includes metal segments 134 and 136, the metal segment lineup 150 includes metal segments 154 and 156, and the metal segment lineup 170 includes metal segments 174 and 176. In some embodiments, each of the metal segments is configured as a dummy conductor. In FIG. 3B, each of the metal segments is configured as a floating node. In FIG. 4B, each of the metal segments is connected to a signal ground. The metal conducting lines 120, 140, and 160 are correspondingly configured to carry a Signal 1, a Signal 2, and a Signal 3. When the metal segments are connected to the signal ground, as shown in FIG. 4B, the cross couplings between the metal conducting lines 120, 140, and 160 are reduced.

Figure 4C:
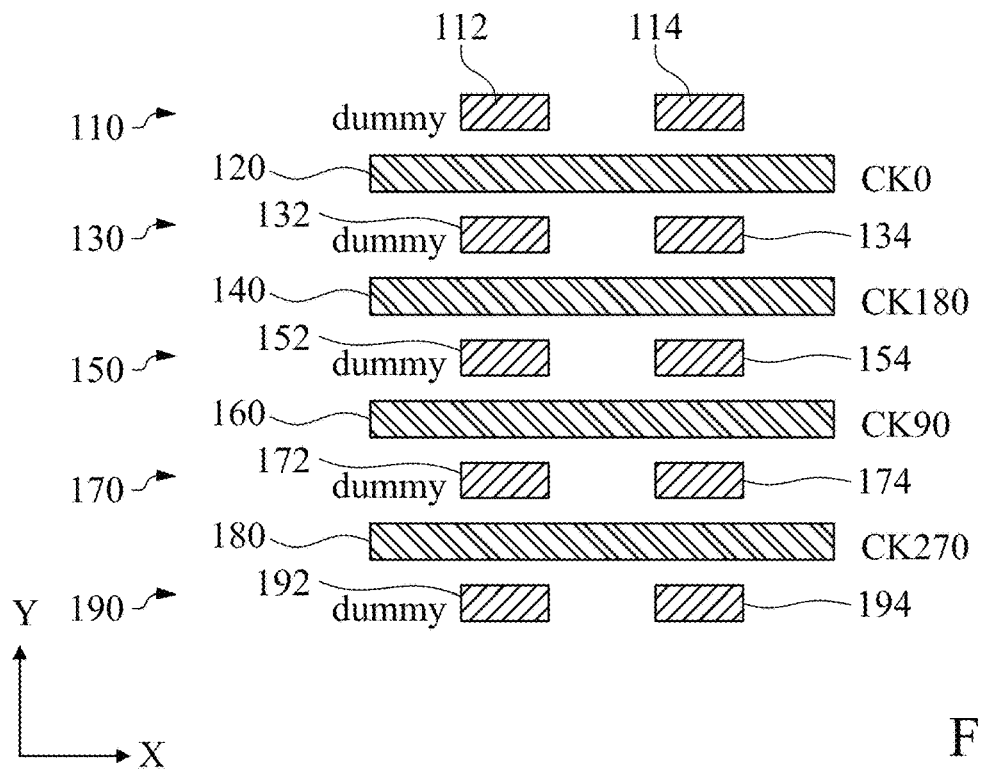

In FIG. 3C and FIG. 4C, a signal bus is implemented with four metal conducting lines 120, 140, 160, and 180 identified with the first layout color. Metal segment lineups 110, 130, 150, 170, and 190 identified with the second layout color are formed in the metal layer that the four metal conducting lines 120, 140, 160, and 180 are formed. Metal segment lineups 110, 130, 150, 170, and 190 are interlaced with the two metal conducting lines 120, 140, 160, and 180. In FIG. 3C and FIG. 4C, each of the metal segment lineups includes multiple metal segments. For example, the metal segment lineup 110 includes metal segments 114 and 116, the metal segment lineup 130 includes metal segments 134 and 136, the metal segment lineup 150 includes metal segments 154 and 156, the metal segment lineup 170 includes metal segments 174 and 176, and the metal segment lineup 190 includes metal segments 194 and 196. In some embodiments, each of the metal segments is configured as a dummy conductor. In FIG. 3C, each of the metal segments is configured as a floating node. In FIG. 4C, each of the metal segments is connected to a signal ground. The metal conducting lines 120, 140, 160, and 180 are correspondingly configured to carry a Signal CK0, a Signal CK180, a Signal CK90, and a Signal CK270. When the metal segments are connected to the signal ground, as shown in FIG. 4C, the cross couplings between the metal conducting lines 120, 140, 160, and 180 are reduced. In some embodiments, the Signal CK0, the Signal CK90, the Signal CK180, and the Signal CK270 are correspondingly a 0-degree phase-shifted clock signal, a 90-degree phase-shifted clock signal, a 180-degree phase-shifted clock signal, and a 270-degree phase-shifted clock signal.

Figure 4D:
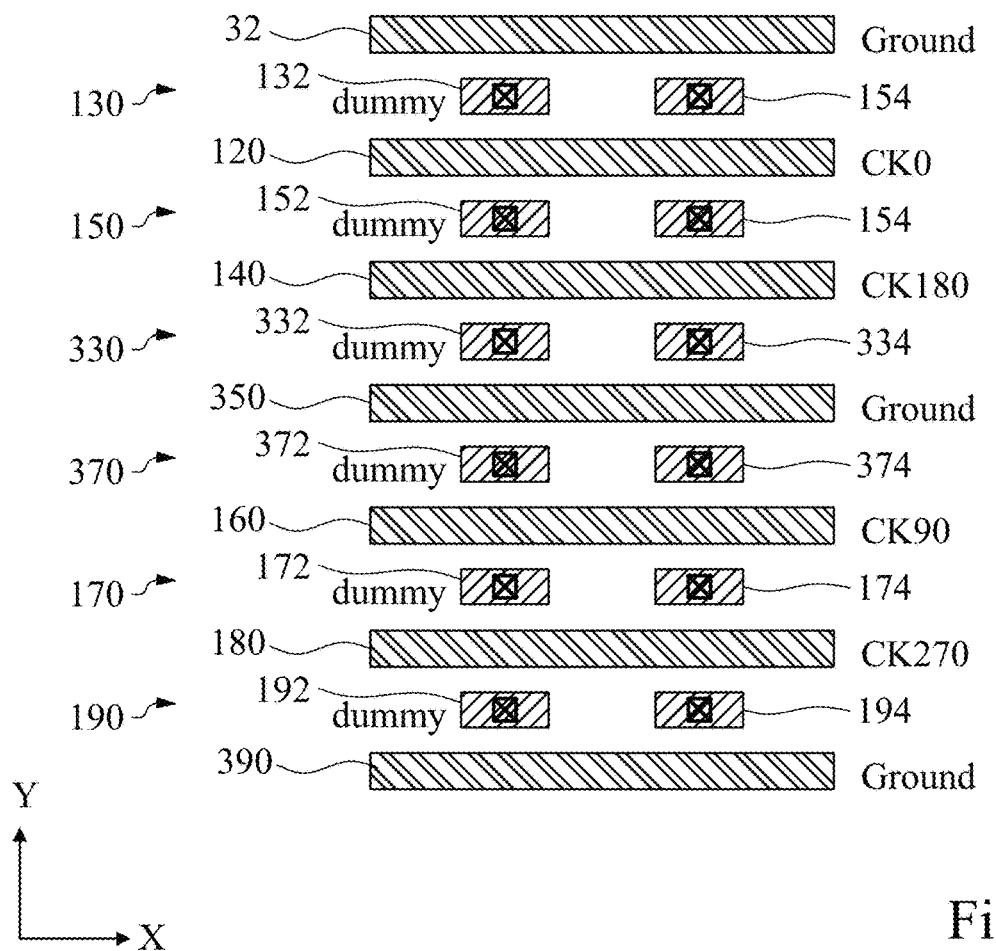

The signal bus in FIG. 3D and FIG. 4D is a modification of the signal bus in FIG. 3C and FIG. 4C. Like the signal bus in in FIG. 3D and FIG. 4D, a signal bus in FIG. 3D and FIG. 4D also includes four metal conducting lines 120, 140, 160, and 180 identified with the first layout color and includes metal segment lineups 110, 130, 150, 170, and 190 identified with the second layout color. In addition, metal conducting lines 310, 350, and 350 identified with the first layout color are formed along with the four metal conducting lines 120, 140, 160, and 180, metal segment lineups 330 and 370 identified with the second layout color are formed along with the metal segment lineups 110, 130, 150, 170, and 190. The metal conducting lines 310, 350, and 350 are configured to be connected to the ground. Consequently, the signals on the four metal conducting lines 120 and 140 are shielded from the environment by the metal conducting lines 310 and 350, and the signals on the four metal conducting lines 160 and 180 are shielded from the environment by the metal conducting lines 350 and 390. In FIG. 3D and FIG. 4D, each of the metal segment lineups 330 and 370 also includes multiple metal segments. For example, the metal segment lineup 330 includes metal segments 332 and 334, and the metal segment lineup 370 includes metal segments 372 and 374. In FIG. 3D, each of the metal segments in the metal segment lineups 330 and 370 is also configured as a floating node. In FIG. 4D, each of the metal segments and the metal segment lineups 330 and 370 is also connected to a signal ground.

In FIGS. 3A-3D and FIGS. 4A-4D, each of the metal segments in the metal segment lineups identified with the second layout color is configured as a dummy conductor. A metal segment is a dummy conductor when the metal segment is not used to carry time-varying signals from a transmitting device to a receiving device.

Figure 5A:
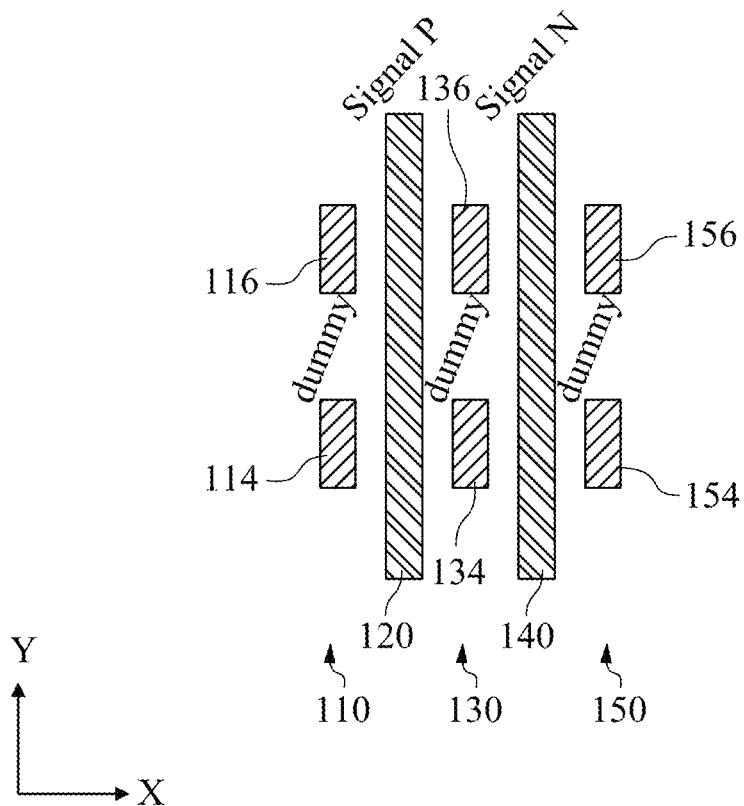
FIGS. 5A-5D are layout diagrams of signal buses implemented with metal conducting lines identified with the same layout color, in accordance with some embodiments.
Figure 5B:
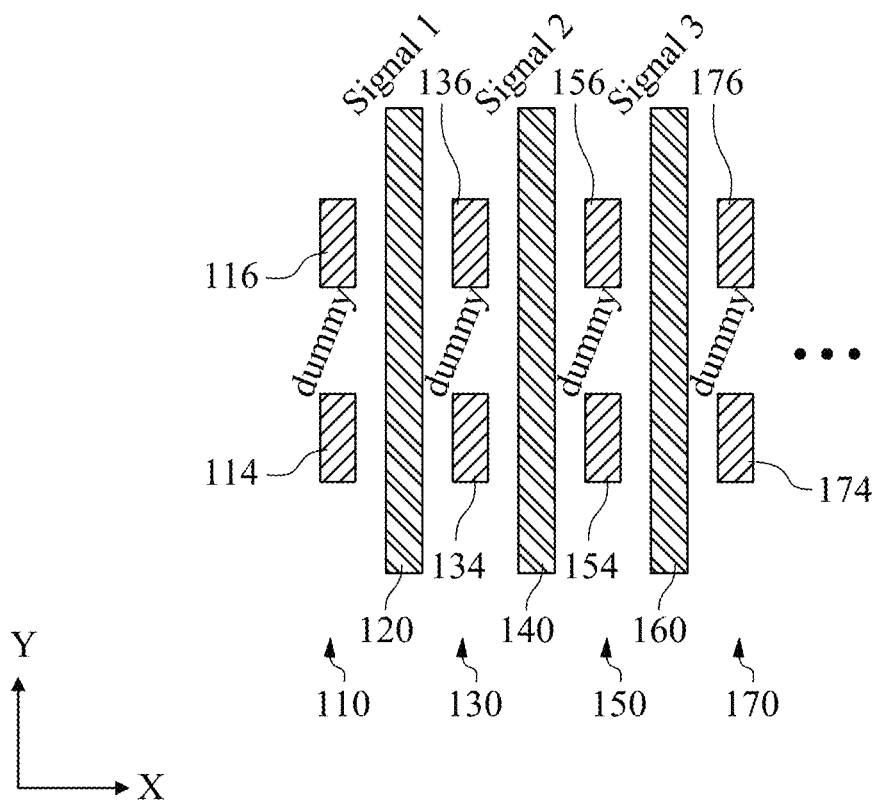
Figure 5C:
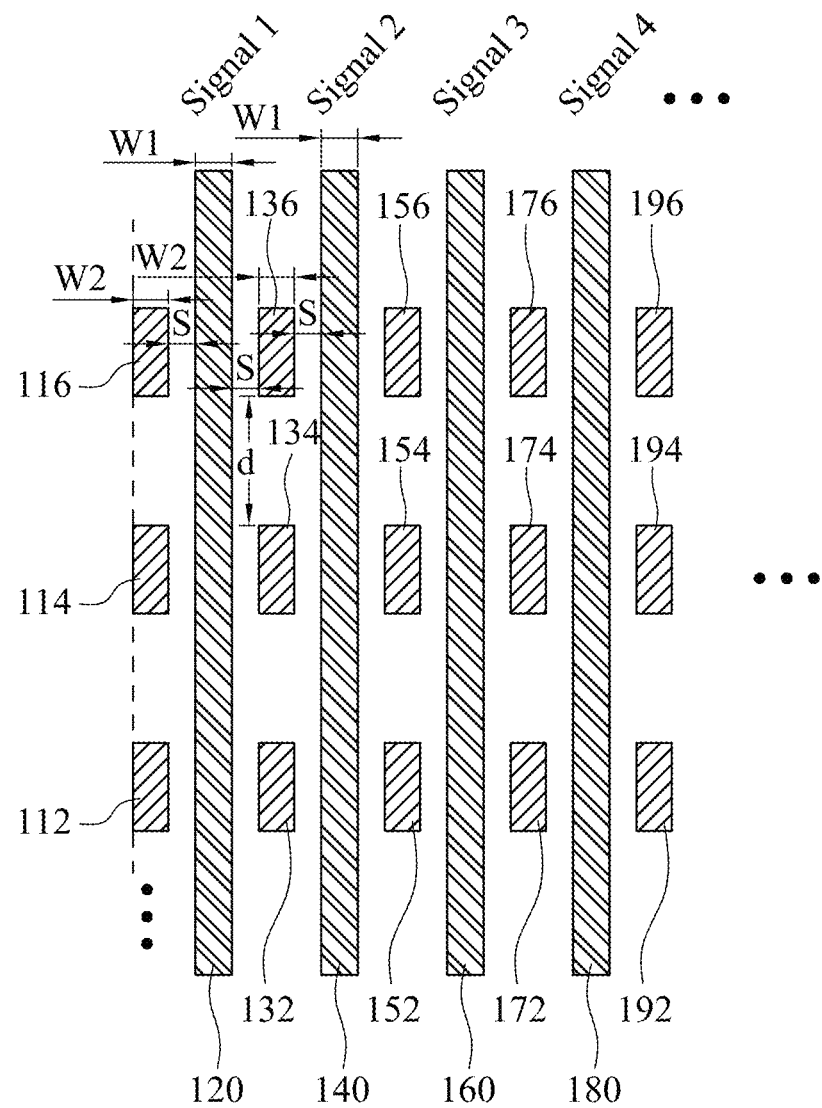

In FIGS. 3A-3D and FIGS. 4A-4D, the metal conducting lines identified with the first layout color all extend in the X-direction, while the gate-conductors (shown such as in FIG. 1 and FIG. 2A-2C) underneath the metal conducting lines extend in the Y-direction. In some alternative embodiments, the metal conducting lines identified with the first layout color all extend in the Y-direction, as shown in the examples of FIGS. 5A-5D. The signal buses in FIGS. 5A-5C are correspondingly modified from the signal bus in FIGS. 3A-3C by changing the extending direction of the metal conducting lines identified with the first layout color and the metal segment lineups identified with the second layout color (all changed from the X-direction to the Y-direction). The modifications of the signal bus in FIG. 3D and the signal buses in FIGS. 4A-4D by changing the bus direction from the X-direction to the Y-direction are also within the contemplated scope of the present disclosure, which are not explicitly shown in the example figures.

Figure 5D:
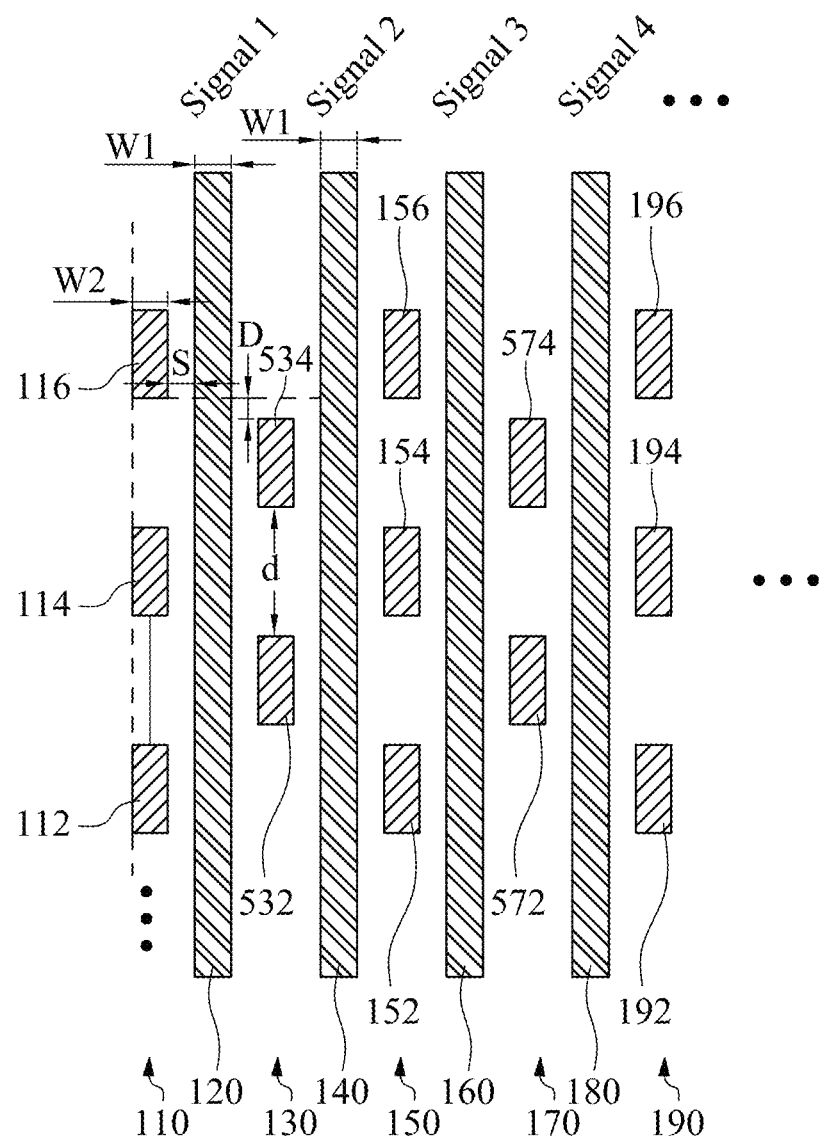

The signal bus in FIG. 5D is modified from the signal bus in FIG. 5C by changing the number of metal segments in the metal segment lineups 130 and 170 and by changing the positions of the metal segments. Specifically, each of the metal segment lineups 130 and 170 as shown in FIG. 5C includes three metal segments, while each of the metal segment lineups 130 and 170 as shown in FIG. 5D includes two metal segments. Additionally, each of metal segments in the metal segment lineups 130 and 170 in FIG. 5C is aligned horizontally (along the X-direction) with corresponding metal segments in the metal segment lineups 110, 150 and 190. In contrast, each of the metal segments in the metal segment lineups 130 and 170 in FIG. 5D is not aligned horizontally (along the X-direction) with the metal segments in the metal segment lineups 110, 150 and 190. The metal segment lineups 130 and 170 in FIG. 5D is shifted vertically (along the Y-direction) relative to the metal segments in the metal segment lineups 110, 150 and 190.

In FIGS. 5C-5D, the width of each metal conducting line is designed as W1, and the width of each metal segment is designed as W2, and the separation distance between edges of a metal segment and a metal conducting line is designated as S. Additionally, the separation distance between edges of metal segments in a metal segment lineup is designated as d. In some embodiments, each of the width W2 and the separation distance S is scaled from the width W1 with a scaling factor $S_{SCALE}$, in the form of $W2=W1*S_{SCALE}$ and $S=W1*S_{SCALE}$. The separation distance d is scaled from the width W1 with a scaling factor $d_{SCALE}$, in the form of $d=W1*d_{SCALE}$ In FIG. 5D, the separation distance between edges of a metal segment in metal segment lineups 130 and 170 and a corresponding metal segment in metal segment lineups 110, 150 and 190 is designated as D.

In FIGS. 5C-5D, when the positions of the metal segments 112, 114, and 116 are correspondingly aligned horizontally (along the X-direction) with the positions of the metal segments 152, 154, and 156, the matching between the delay time of the Signal 1 (on the metal conducting line 120) and the delay time of the Signal 2 (on the metal conducting line 140) is improved, as compared with alternative implementations in which the positions of corresponding metal segments are not aligned horizontally. Similarly, when the positions of the metal segments 152, 154, and 156 are correspondingly aligned horizontally (along the X-direction) with the positions of the metal segments 192, 194, and 196, the matching between the delay time of the Signal 3 (on the metal conducting line 160) and the delay time of the Signal 4 (on the metal conducting line 180) is improved, as compared with alternative implementations in which the positions of corresponding metal segments are not aligned horizontally.

Figure 6A:
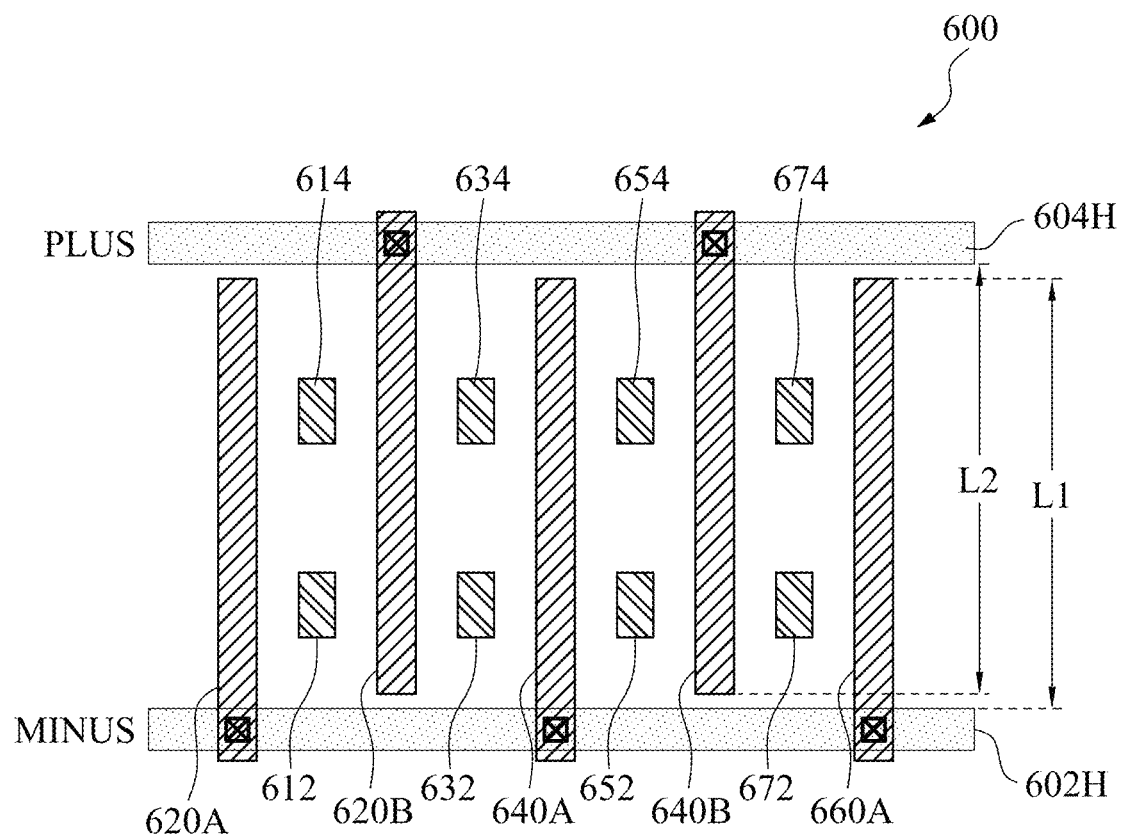

In some embodiments, metal conducting lines identified with the same layout color are used to implement metal-oxide-metal (MOM) capacitors. FIGS. 6A-6B are layout diagrams of MOM capacitors implemented with metal conducting lines identified with the same layout color, in accordance with some embodiments. In FIGS. 6A-6B, the MOM capacitor 600 includes metal conducting lines and metal segments all formed with a double patterning process. The metal conducting lines 620A, 620B, 640A, 640B, and 660A in the MOM capacitor 600 are identified with a first layout color. The metal segments 612, 614, 632, 634, 652, 654, 672, and 674 in the MOM capacitor 600 are identified with a second layout color. In some embodiments, the metal conducting lines identified with the first layout color is defined by a first photolithography mask, while the metal segments identified with the second layout color is defined by a second photolithography mask.

In FIGS. 6A-6B, the metal segments 612 and 614 are between the metal conducting lines 620A and 620B. The metal segments 632 and 634 are between the metal conducting lines 620B and 640A. The metal segments 652 and 654 are between the metal conducting lines 640A and 640B. The metal segments 672 and 674 are between the metal conducting lines 640B and 660A. The metal conducting lines 620A, 620B, 640A, 640B, and 660A all extends in the Y-direction. The MOM capacitor 600 includes lead conducting lines 602H and 604H extends in the X-direction.

In FIG. 6A, the lead conducting lines 602H and 604H are formed in a metal layer different from the metal layer in which the metal conducting lines 620A, 620B, 640A, 640B, and 660A are formed. Each of the metal conducting lines 620A, 640A, and 660A is connected to the lead conducting lines 602H through a corresponding via connector. Each of the metal conducting lines 620B and 640B is connected to the lead conducting lines 604H through a corresponding via connector. In FIG. 6B, the lead conducting lines 602H and 604H are formed in the same metal layer in which the metal conducting lines 620A, 620B, 640A, 640B, and 660A are formed. The lead conducting lines 602H and 604H are also identified with the first layout color and formed with other metal conducting lines (620A, 620B, 640A, 640B, and 660A) in the same double patterning process. Each of the metal conducting lines 620A, 640A, and 660A is connected to the lead conducting line 602H directly in the same metal layer. Each of the metal conducting lines 620B and 640B is connected to the lead conducting line 604H directly in the same metal layer. In some embodiments, as shown in FIGS. 6A-B, each of the metal conducting lines 620A, 640A, and 660A has a first length L1, and each of the metal conducting lines 620B and 640B has a second length L2. In some embodiments, the first length L1 is equal to the second length L2.

Figure 10A:
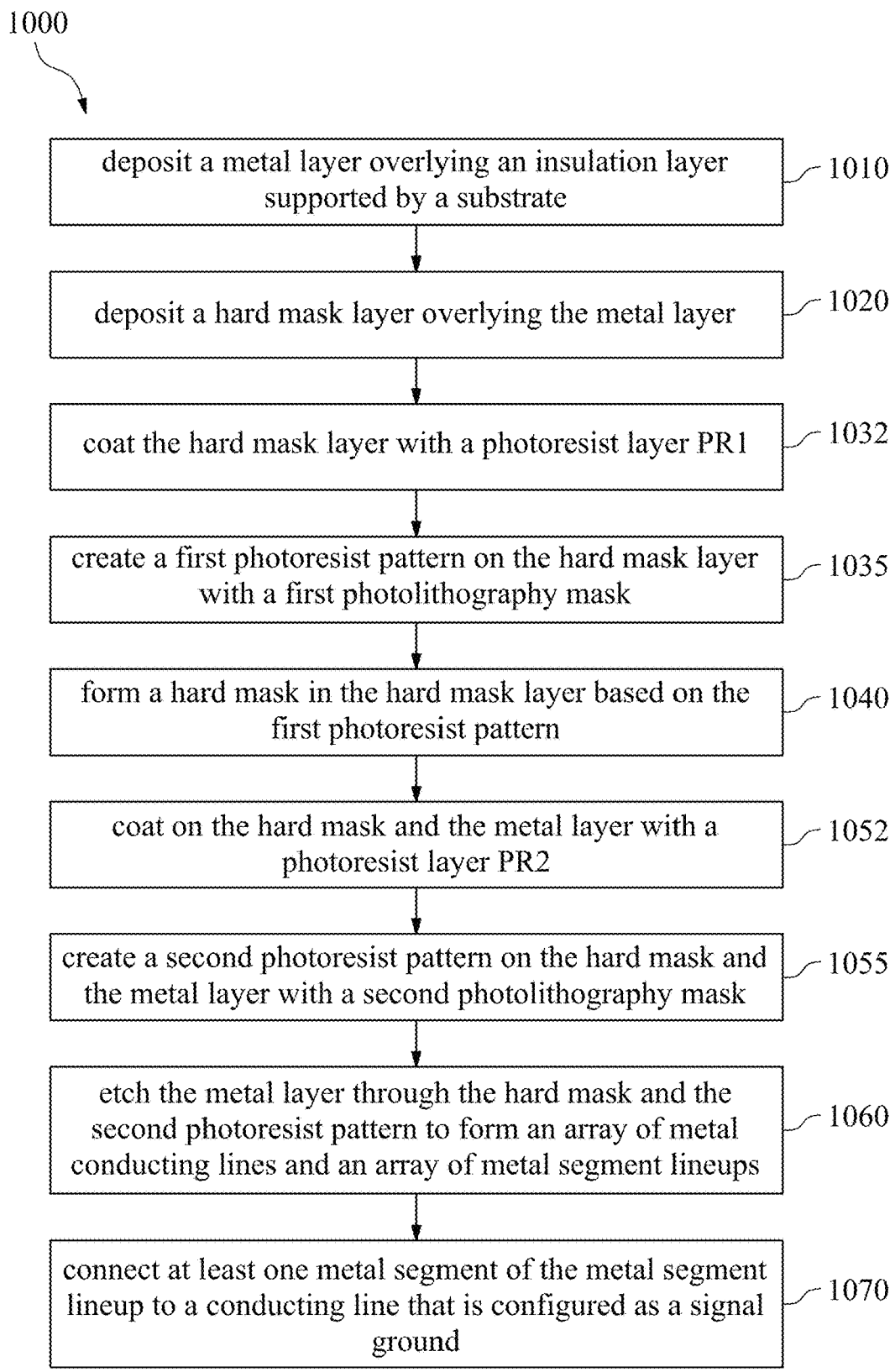
FIGS. 10A-10B are flowcharts of methods of manufacturing metal conducting lines interlaced with metal segment lineups using a double patterning process, in accordance with some embodiments.

FIG. 10A is a flowchart of a method 1000 of manufacturing metal conducting lines interlaced with metal segment lineups using a double patterning process, in accordance with some embodiments. The sequence in which the operations of method 1000 are depicted in FIG. 10A is for illustration only; the operations of method 1000 are capable of being executed in sequences that differ from that depicted in FIG. 10A. It is understood that additional operations may be performed before, during, and/or after the method 1000 depicted in FIG. 10A, and that some other processes may only be briefly described herein.

Figure 7A:
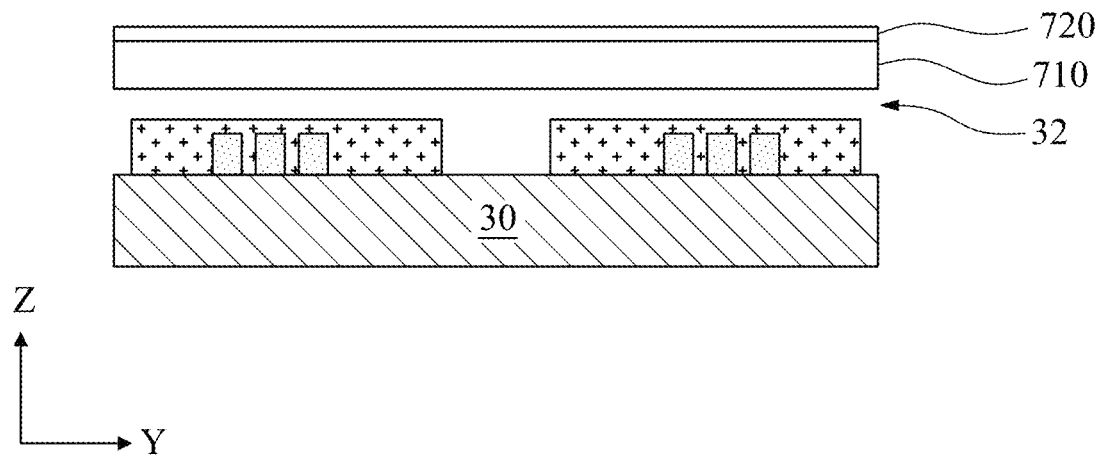
FIG. 7A and FIG. 7B are cross-sectional views of device structures during the fabrication of the integrated circuits in FIG. 1 using the method of FIG. 10A or FIG. 10B, in accordance with some embodiments.
Figure 7B:
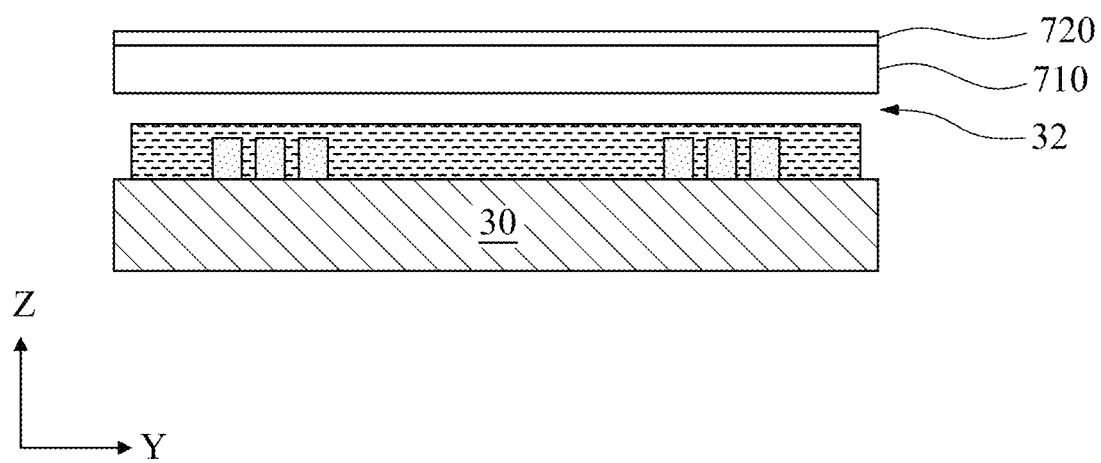

The operations of method 1000 in FIG. 10A are performed during the back-end-of-line (BEOL) process. In operation 1010 of method 1000, a metal layer is deposited on an insulation layer supported by a substrate. In operation 1020 of method 1000, a hard mask layer is deposited on the metal layer. In some embodiments, the insulation layer on which the metal layer is deposited is the top insulation layer fabricated in the front-end-of-line (FEOL) process, and the metal layer deposited in operation 1010 is the first metal layer M0 above the top insulation layer. In the example embodiments as shown in FIG. 7A/FIG. 7B, a metal layer 710 is deposited on the insulation layer 32, and a hard mask layer 720 is deposited on the metal layer 710. The cross-sectional views of the device structures in FIG. 7A/FIG. 7B correspond to the cross-sectional views of the device structures in FIG. 2A/FIG. 2B after the completion of the front-end-of-line (FEOL) process. Specifically, the device structures in FIG. 7A/FIG. 7B at a fabrication stage that is before the metal layer is deposited on the insulation layer 32 is the same as the device structures in FIG. 2A/FIG. 2B at a fabrication stage that is after the deposition of the insulation layer 32 but before both the formation of the metal conducting lines 120 and 140 and the formation of the metal segments 114, 134, and 154.

FIG. 8A1/FIG. 8B1 to FIG. 8A7/FIG. 8B7 are cross-sectional views of device structures during the fabrication of the integrated circuits in FIG. 1 with the method 1000 of FIG. 10A, in accordance with some embodiments. As a first example of explaining the operations in the method 1000, in FIG. 8A1/FIG. 8B1 to FIG. 8A7/FIG. 8B7, a hard mask formed in the hard mask layer 720 is used to define the metal conducting lines 120 and 140 in the metal layer 710, while a photoresist pattern is used to define the metal segments 114, 134, and 154 in the metal layer 710.

In operation 1032 of method 1000, as shown in FIG. 8A1/FIG. 8B1, the hard mask layer 720 is coated with a photoresist layer PR1. After the photoresist layer PR1 is exposed with light passing through a photolithography mask MK1 (as shown in FIG. 8A1/FIG. 8B1), in operation 1035 of method 1000, as shown in FIG. 8A2/FIG. 8B2, a photoresist pattern (having photoresists 820P and 840P) is created on the hard mask layer 720. In operation 1040 of method 1000, when the hard mask layer 720 is dry etched with a plasma, only the areas in the hard mask layer 720 that are protected by the photoresists 820P and 840P remain in the hard mask layer 720. Then, after the photoresists 820P and 840P are stripped off, as shown in FIG. 8A3/FIG. 8B3, a hard mask having hard mask patterns 820 and 840 is formed in the hard mask layer 720. After operation 1040, the process flow proceeds to operation 1052.

In operation 1052 of method 1000, as shown in FIG. 8A4/FIG. 8B4, the hard mask patterns 820 and 840 and the metal layer 710 are coated with a photoresist layer PR2. After the photoresist layer PR2 is exposed with light passing through a photolithography mask MK2 (as shown in FIG. 8A4/FIG. 8B4), in operation 1055 of method 1000, as shown in FIG. 8A5/FIG. 8B5, a photoresist pattern (having photoresists 814P, 834P, and 854P) is created on the metal layer 710. After operation 1055, the process flow proceeds to operation 1060.

In operation 1060 of method 1000, the metal layer formed in operation 1010 is etched through the hard mask formed in operation 1040 and the photoresist pattern formed in operation 1055, whereby an array of metal conducting lines and an array of metal segment lineups are fabricated. In the example as shown in FIG. 8A6/FIG. 8B6, when the metal layer 710 is dry etched with a plasma, only the areas in the metal layer 710 that are protected by the hard mask patterns 820 and 840 or protected by the photoresists 814P, 834P, and 854P remain in the metal layer 710. Then, after the photoresists 814P, 834P, and 854P are stripped off and the hard mask patterns 820 and 840 are removed, as shown in FIG. 8A7/FIG. 8B7, the metal conducting lines 120 and 140 and the metal segments 114, 134, and 154 are formed in the metal layer on top of the insulation layer 32. After operation 1060, the process flow proceeds to operation 1070.

In operation 1070 of method 1000, at least one of the metal segments of the metal segment lineup is connected to a conducting line that is configured as a signal ground. In some embodiments, multiple metal segments of the metal segment lineup are connected to a signal ground. In some embodiments, each of metal segments of the metal segment lineup is connected to a signal ground. In some embodiments, each of the metal segments of the metal segment lineup is configured to be maintained at a constant voltage.

In some embodiments, at least one of the metal segments of the metal segment lineup is connected to one of the power rails in the integrated circuit. In some embodiments, as shown in FIG. 1, the metal conducting lines 120 and 140 and the metal segments 114, 134, and 154 all extend in the X-direction. The power rails also extend in the X-direction (not shown in the figure) and are formed in same metal layer (e.g., the first metal layer M0) in which the metal segments 114, 134, and 154 are formed. In some embodiments, in operation 1070 of method 1000, when vertical conducting lines are formed in another metal layer (e.g., the second metal layer M1) which is different from the metal layer (e.g., M0) for forming the metal segments 114, 134, and 154, at least one of the metal segments 114, 134, and 154 is connected to one of the power rails by a vertical conducting line through two via connectors between the two metal layers (e.g., M0 and M1).

FIG. 9A1/FIG. 9B1 to FIG. 9A7/FIG. 9B7 are cross-sectional views of device structures during the fabrication of the integrated circuits in FIG. 1 with the method 1000 of FIG. 10A, in accordance with some embodiments. As a second example of explaining the operations in the method 1000, in FIG. 9A1/FIG. 9B1 to FIG. 9A7/FIG. 9B7, a hard mask formed in the hard mask layer 720 is used to define the metal segments 114, 134, and 154 in the metal layer 710, while a photoresist pattern is used to define the metal conducting lines 120 and 140 in the metal layer 710.

In operation 1032 of method 1000, as shown in FIG. 9A1/FIG. 9B1, the hard mask layer 720 is coated with a photoresist layer PR1. After the photoresist layer PR1 is exposed with light passing through a photolithography mask MK2 (as shown in FIG. 9A1/FIG. 9B1), in operation 1035 of method 1000, as shown in FIG. 9A2/FIG. 9B2, a photoresist pattern (having photoresists 914P, 934P, and 954P) is created on the hard mask layer 720. In operation 1040 of method 1000, when the hard mask layer 720 is dry etched with a plasma, only the areas in the hard mask layer 720 that are protected by the photoresists 914P, 934P, and 954P remain in the hard mask layer 720. Then, after the 914P, 934P, and 954P are stripped off, as shown in FIG. 9A3/FIG. 9B3, a hard mask having hard mask patterns 914, 934, and 954 is formed in the hard mask layer 720. After operation 1040, the process flow proceeds to operation 1052.

In operation 1052 of method 1000, as shown in FIG. 9A4/FIG. 9B4, the hard mask patterns 914, 934, and 954 and the metal layer 710 are coated with a photoresist layer PR2. After the photoresist layer PR2 is exposed with light passing through a photolithography mask MK1 (as shown in FIG. 9A4/FIG. 9B4), in operation 1055 of method 1000, as shown in FIG. 9A5/FIG. 9B5, a photoresist pattern (having photoresists 920P and 940P) is created on the metal layer 710. After operation 1055, the process flow proceeds to operation 1060.

In operation 1060 of method 1000, the metal layer formed in operation 1010 is etched through the hard mask formed in operation 1040 and the photoresist pattern formed in operation 1055, whereby an array of metal conducting lines and an array of metal segment lineups are fabricated. In the example as shown in FIG. 9A6/FIG. 9B6, when the metal layer 710 is dry etched with a plasma, only the areas in the metal layer 710 that are protected by the hard mask patterns 914, 934, and 954 or protected by the photoresists 920P and 940P remain in the metal layer 710. Then, after the photoresists 920P and 940P are stripped off and the hard mask patterns 914, 934, and 954 are removed, as shown in FIG. 9A7/FIG. 9B7, the metal conducting lines 120 and 140 and the metal segments 114, 134, and 154 are formed on top of the insulation layer 32. After operation 1060, then, in operation 1070 of method 1000, at least one of the metal segments of the metal segment lineup is connected to a conducting line that is configured as a signal ground.

Figure 10B:
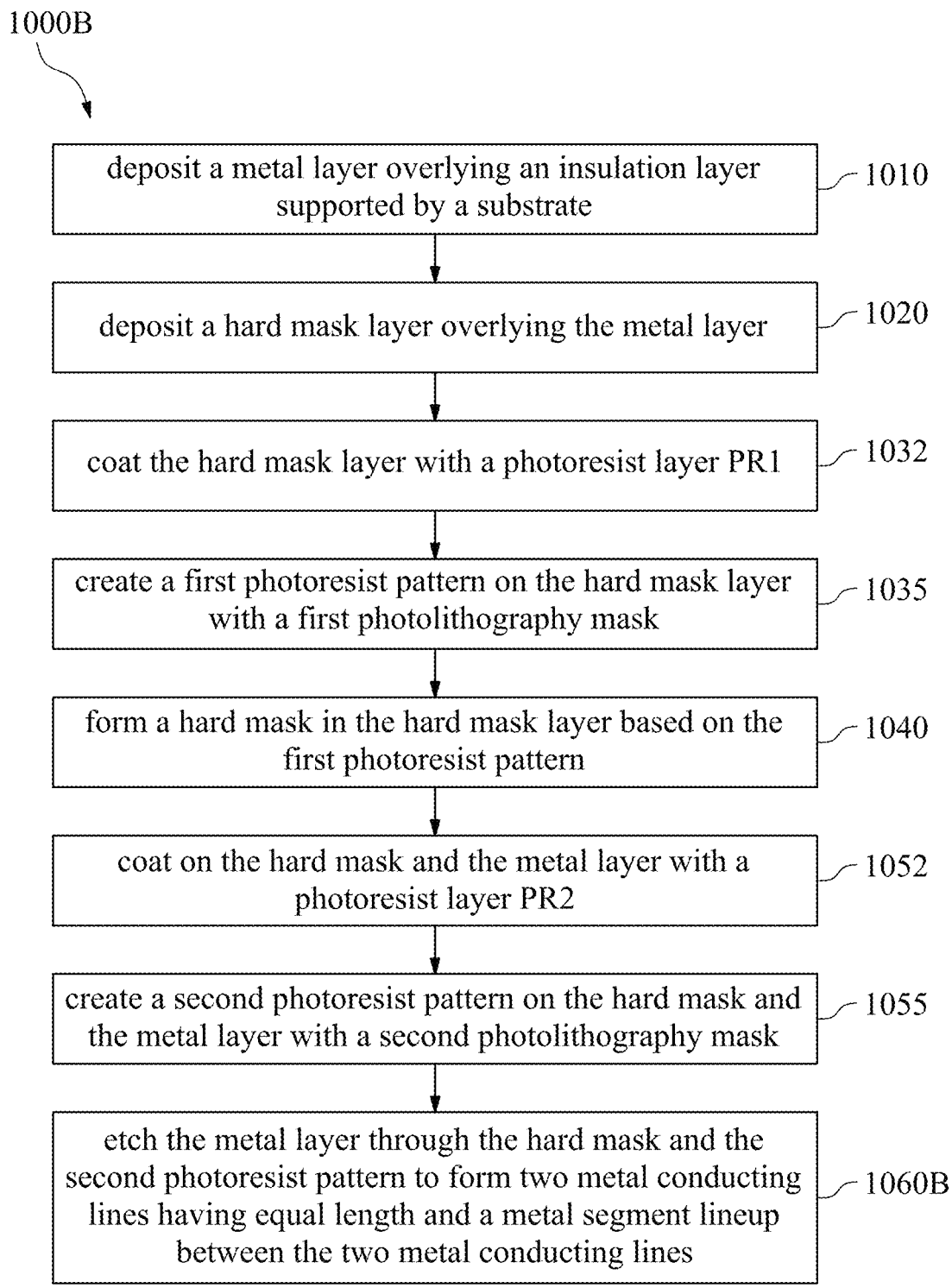

FIG. 10B is a flowchart of a method 1000B of manufacturing metal conducting lines interlaced with metal segment lineups using a double patterning process, in accordance with some embodiments. The method 1000B in FIG. 10B is a modification of the method 1000 in FIG. 10A. The modification includes substituting operation 1060 in FIG. 10A with operation 1060B in FIG. 10B. In addition, operation 1070 is not shown explicitly in FIG. 10B, because operation 1070 is an optional operation in some specific implementations.

In operation 1060B of method 1000B in FIG. 10B, the metal layer formed in operation 1010 is etched through the hard mask formed in operation 1040 and the photoresist pattern formed in operation 1055, whereby two metal conducting lines having equal length and a metal segment lineup between the two metal conducting lines are fabricated. In the example as shown in FIG. 9A6/FIG. 9B6, when the metal layer 710 is dry etched with a plasma, only the areas in the metal layer 710 that are protected by the hard mask patterns 914, 934, and 954 or protected by the photoresists 920P and 940P remain in the metal layer 710. Then, after the photoresists 920P and 940P are stripped off and the hard mask patterns 914, 934, and 954 are removed, as shown in FIG. 9A7/FIG. 9B7, the metal conducting lines 120 and 140 and the metal segment lineup 130 having the metal segment 134 are formed on top of the insulation layer 32. In the example as shown in FIG. 1, the metal conducting lines 120 and 140 having equal length and the metal segment lineup 130 between the metal conducting lines 120 and 140 are formed in a same metal layer. The metal conducting line 120 is electrically coupled between the first input 101 and a first output of the transmitting device through two via connectors, and the distance between the two via connectors is the length of the metal conducting line 120. The metal conducting line 140 is electrically coupled between the second input 102 and a second output of the transmitting device through two via connectors, and the distance between the two via connectors is the length of the metal conducting line 140. The length of the metal conducting line 120 is equal to the length of the metal conducting line 140.

In FIGS. 10A-10B, the methods 1000 and 1000B are used to fabricate an integrated circuit according to the layout diagram of FIG. 1 in which the metal conducting lines are identified with a first layout color and the metal segments are identified with a second layout color. In the first example as shown in FIG. 8A1/FIG. 8B1 to FIG. 8A7/FIG. 8B7 and the second example as shown in FIG. 9A1/FIG. 9B1 to FIG. 9A7/FIG. 9B7, the double patterning technique uses a hard mask to express one of the two layout colors and uses photoresists patterns to express the other one of the two layout colors, and the hard mask and the photoresists patterns are created based on two photolithography masks. In some alternative implementations, the double patterning technique uses a first hard mask to express one of the two layout colors and uses a second hard mask to express the other one of the two layout colors, and the first hard mask and the second hard mask are created based on two photolithography masks. Other methods to express the two layout colors with the double patterning technique are within the contemplated scope of the present disclosure. Other implementations of the double patterning technique are within the contemplated scope of the present disclosure.

The meanings of the layout colors in this disclosure are to be broadly interpreted to include any identification means to distinguish that the formation process of the metal conducting lines is different from the formation process of the metal segments using the double patterning technique. In some embodiments, the two layout colors in the layout diagram have different hues. In some embodiments, the two layout colors in the layout diagram have the same hue but different diagram patterns (e.g., a crossline pattern versus a slash-line pattern).

In the embodiments as shown in FIGS. 3A-3D, FIGS. 4A-4D, and FIGS. 5A-5D, metal conducting lines are identified with a first layout color are implemented as signal lines, and the metal conducting lines are interlaced with metal segments that are identified with a second layout color. In some embodiments, the metal conducting lines are fabricated in in the first metal layer M0 above the top insulation layer formed in the front-end-of-line (FEOL) process, while the metal conducting lines in the first metal layer M0 are used for cell-tracks for intra cell communications. In some embodiments, the metal conducting lines are fabricated in the second metal layer M1 overlying an interlayer dielectric above the first metal layer M0, while the metal conducting lines in the second metal layer M1 are used for cell-tracks for intra cell communications.

In some embodiments, the metal conducting lines in the second metal layer M1, when used for cell-tracks, are not limited. to metal conducting lines that are identified with only one layout color. In some embodiments, the cell-tracks are fabricated in the second metal layer M1 and include metal conducting lines identified with one or more layout colors. In some embodiments, various configurations of the cell-tracks in the second metal layer M1 are used to provide cell implementations having different preset functions for various purposes.

Figure 11:
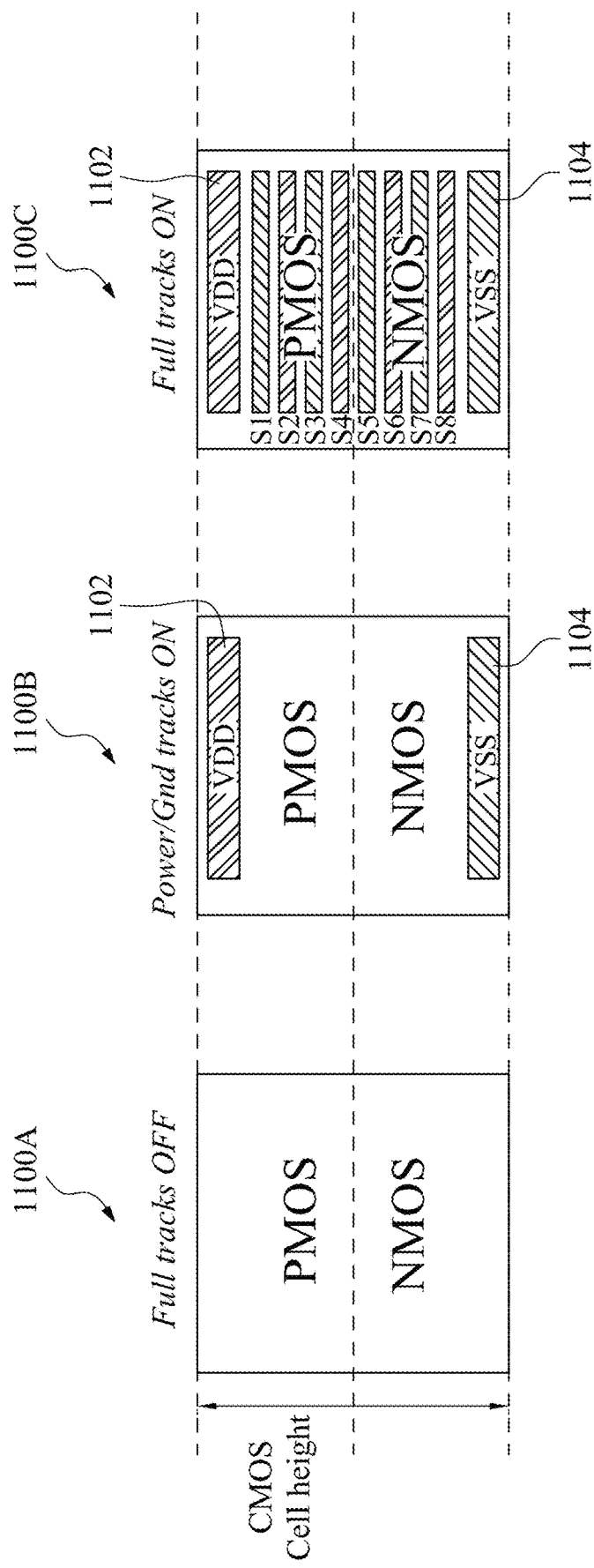
FIGS. 11-14 are layout diagrams of cell implementations having preset functions, in accordance with some embodiments.

FIGS. 11-14 are layout diagrams of cell implementations having preset functions, in accordance with some embodiments. In FIG. 11, three cell layouts 1100A, 1100B, and 1100C are implemented correspondingly with the features "Full tracks OFF", "Power/Ground ON", and "Full tracks ON." When the cell layout 1100A is selected with the feature "Full tracks OFF", the cell based on the layout 1100A does not have cell-tracks in the second metal layer M1. When the cell layout 1100B is selected with the feature "Power/Ground ON", the cell based on the layout 1100B does not have cell-tracks for signal routing in the second metal layer M1 but has power pads 1102 and 1104 in the second metal layer M1. When the cell layout 1100C is selected with the feature "Full tracks ON," the cell based on the layout 1100C not only has cell-tracks S1-S8 for signal routing in the second metal layer M1 but also has power pads 1102 and 1104 in the second metal layer M1.

In the cell implemented based on the layout 1100B or the layout 1100C, in some embodiments, the power pads 1102 and 1104 are correspondingly configured for receive the first supply voltage VDD and the second supply voltage VSS from a power grid. The power pads 1102 and 1104 then correspondingly provide the supply voltages VDD and VSS to the transistors underneath the second metal layer M1 and the first metal layer M0.

Figure 12:
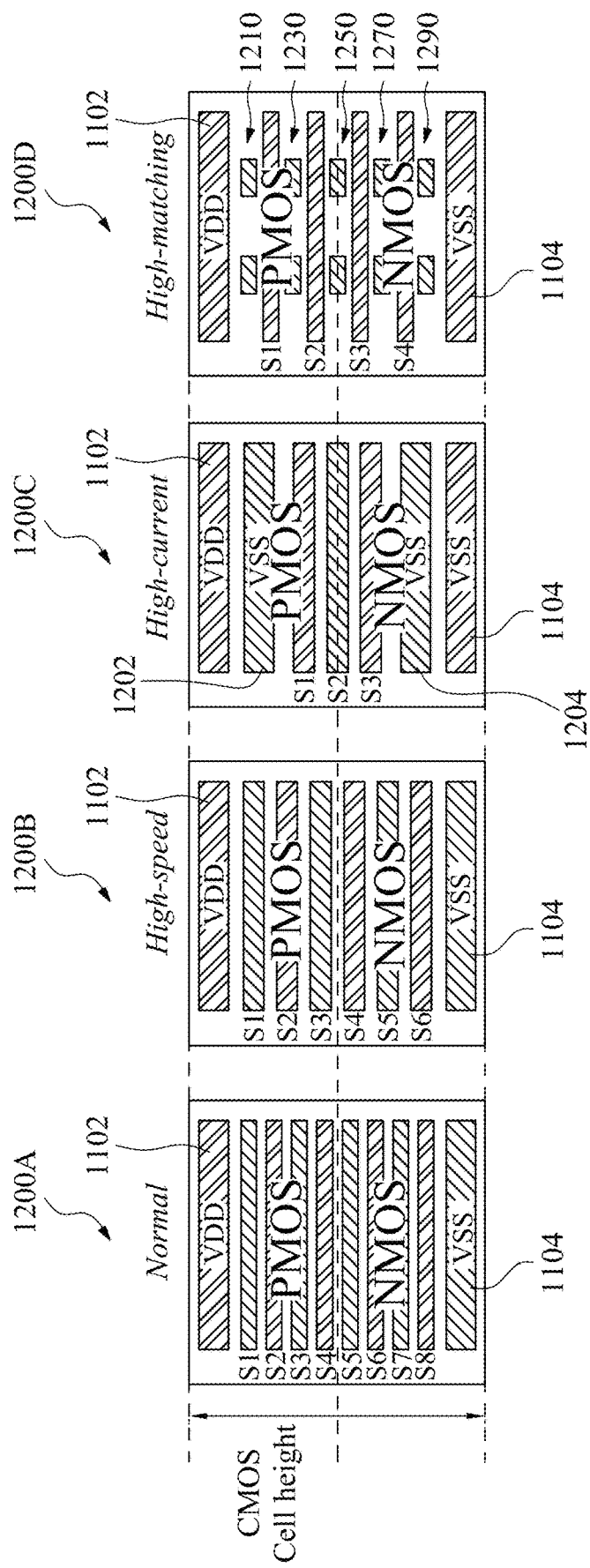

In FIG. 12, four cell layouts 1200A, 1200B, 1200C, and 1200D are correspondingly implemented with the features "Normal", "High-speed", "High-current", and "High-matching." When one of the cell layouts 1200A, 1200B, and 1200D is selected with the features "Normal", "High-speed", or "High-matching," the cell implemented based on the corresponding layout has one power pad 1102 for the first supply voltage VDD and one power pad 1104 for the second supply voltage VSS. The power pads 1102 and 1104 are in the second metal layer M1. When the cell layout 1200C is selected the feature "High-current," the cell implemented based on the layout 1200C has two power pads 1102 and 1202 for the first supply voltage VDD and two power pads 1104 and 1204 for the second supply voltage VSS. The cell based on the layout 1200C has a smaller IR drop as compared with the cells based on the layouts 1200A, 1200B, or 1200D, when the current is provided to the transistors in the cells through the power pads. Like the power pads 1102 and 1104, the power pads 1202 and 1204 are also in the second metal layer M1.

In the example of FIG. 12, the cell based on the layout 1200A has eight cell-tracks S1-S8 for signal routing, the cell based on the layout 1200B has six cell-tracks S1-S6 for signal routing, the cell based on the layout 1200C has three cell-tracks S1-S3 for signal routing, and the cell based on the layout 1200D has four cell-tracks S1-S4 for signal routing. Each of the cell-tracks as shown in FIG. 12 is in the second metal layer M1.

When a cell based on the layout 1200A is changed to a cell based on the layout 1200B, the number of cell-tracks is reduced, but the width of each cell-track is increased. Increasing the width of a cell-track reduces the RC delay and improves the speed performance of the cell. When the speed of a cell needs to be optimized, the cell based on the layout 1200B with the feature "High-speed" is a better choice among the four layouts 1200A, 1200B, 1200C, and 1200D.

When a cell based on the layout 1200A is changed to a cell based on the layout 1200C, the IR drop from the power grid to the transistors in the cell is reduced. Therefore, when the current provided to a cell needs to be optimized, the cell based on the layout 1200C with the feature "High-current" is a better choice among the four layouts 1200A, 1200B, 1200C, and 1200D.

In the example of FIG. 12, when RC delay variations among the cell-tracks in a cell need to be minimized, the cell based on the layout 1200D with the feature "High-matching" is selected from the four layouts 1200A, 1200B, 1200C, and 1200D. The cell based on the layout 1200D includes metal segments 1210, 1230, 1250, 1270, and 1290 between various cell-tracks and power pads. The metal segments 1210 is between the power pad 1102 and the cell-track S1, the metal segments 1230 is between the cell-track S1 and the cell-track S2, the metal segments 1250 is between the cell-track S2 and the cell-track S3, the metal segments 1270 is between the cell-track S3 and the cell-track S4, and the metal segments 1290 is between the cell-track S4 and the power pad 1104.

Figure 13:
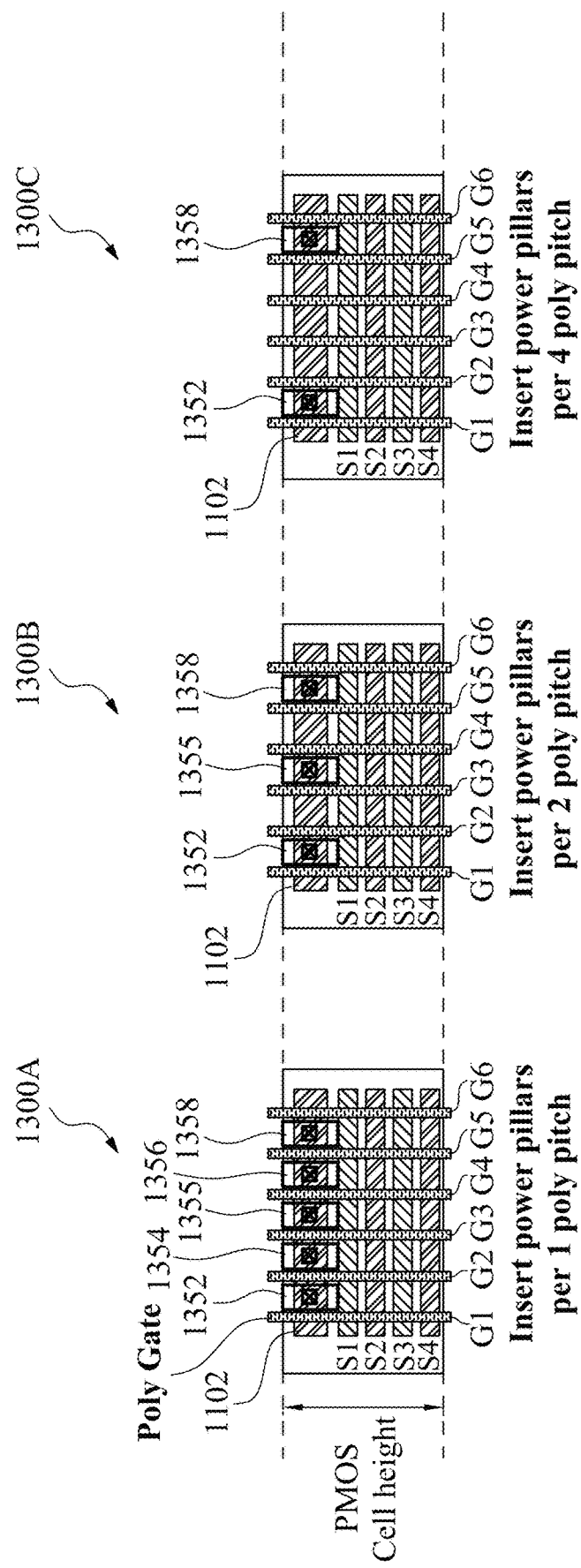

FIG. 13 are cell layouts 1300A, 1300B, and 1300C with various power pillar densities. Because of the different power pillar densities in the cell layouts, the selection of one of the cell layouts in FIG. 13 allows a compromise to be made between a higher power pillar density for lowing IR drop and a larger available layout area in the first metal layer M0. In addition to cell-tracks S1-S4, each cell layout in FIG. 13 also include gate conductors G1-G6. The cell layout 1300A includes power pillars 1352, 1354, 1355, 1356, and 1358, and there is one power pillar between each adjacent gate conductors. The cell layout 1300B includes a power pillar 1352 between gate conductors G1 and G2, a power pillar 1355 between gate conductors G3 and G4, and a power pillar 1358 between gate conductors G5 and G6. The cell layout 1300C includes a power pillar 1352 between gate conductors G1 and G2 and a power pillar 1358 between gate conductors G5 and G6. In FIG. 13, only the cell layout areas in the PMOS half part of the cell is shown, and the cell layout areas in the NMOS half part of the cell have similar layout structures.

Figure 14:
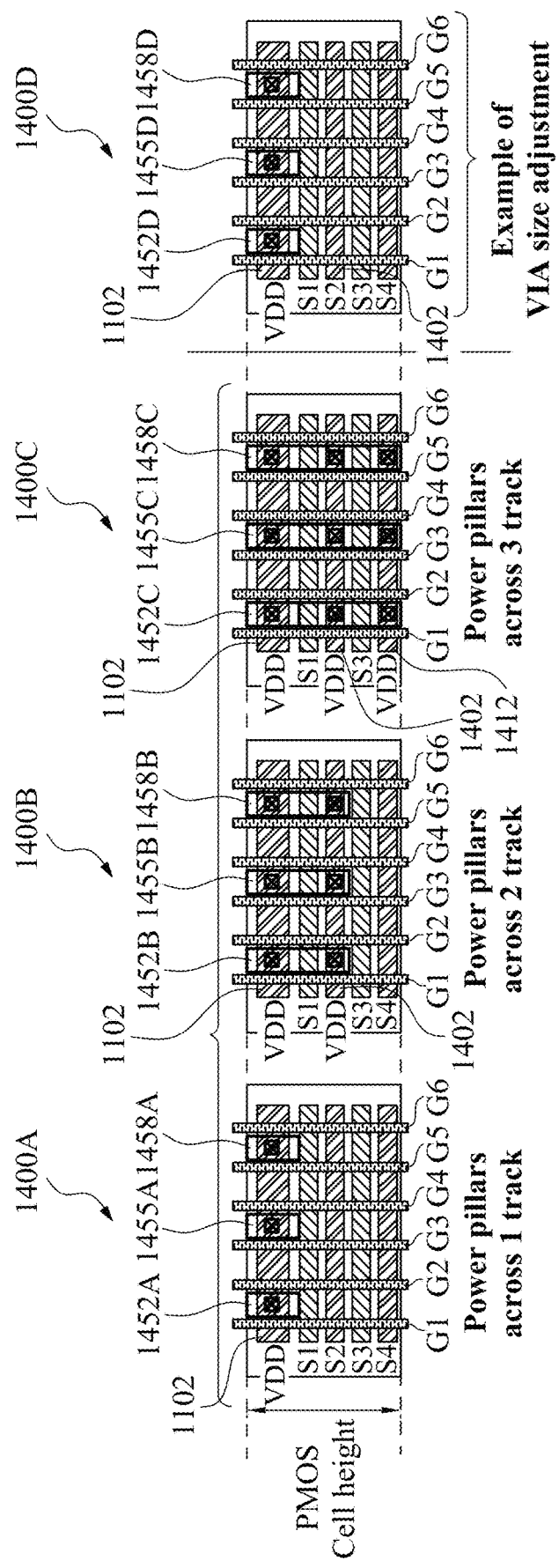

FIG. 14 are cell layouts 1400A, 1400B, 1400C, and 1400D with various power pillar size and number of power pads. Because of the different power pillar size and/or the number of power pads in the cell layouts, the selection of one of the cell layouts in FIG. 4 allows a compromise to be made between a smaller IR drop and a larger available layout area in the first metal layer M0. Each of the cell layouts 1400A, 1400B, 1400C, and 1400D includes three power pillars. In FIG. 14, only the cell layout areas in the PMOS half part of the cell is shown, and the cell layout areas in the NMOS half part of the cell have similar layout structures.

Each of the cell layout 1400A and the cell layout 1400 D includes one power pad 1102 for the first supply voltage VDD. The power pad 1102 in the cell layout 1400A is connected to the three power pillars 1452A, 1455A, and 1458A. The power pad 1102 in the cell layout 1400D is connected to the three power pillars 1452D, 1455D, and 1458D. The via size of the power pillars (1452A, 1455A, or 1458A) as shown in the cell layout 1400A is different from the via size of the power pillars (1452D, 1455D, or 1458D) as shown in the cell layout 1400D.

The cell layout 1400B includes two power pads 1102 and 1402 for the first supply voltage VDD. Each of the two power pads 1102 and 1402 in the cell layout 1400B is connected to the three power pillars 1452B, 1455B, and 1458B. The cell layout 1400C includes three power pads 1102, 1402, and 1412 for the first supply voltage VDD. Each of the three power pads 1102, 1402, and 1412 in the cell layout 1400C is connected to the three power pillars 1452C, 1455C, and 1458C.

Figure 15:
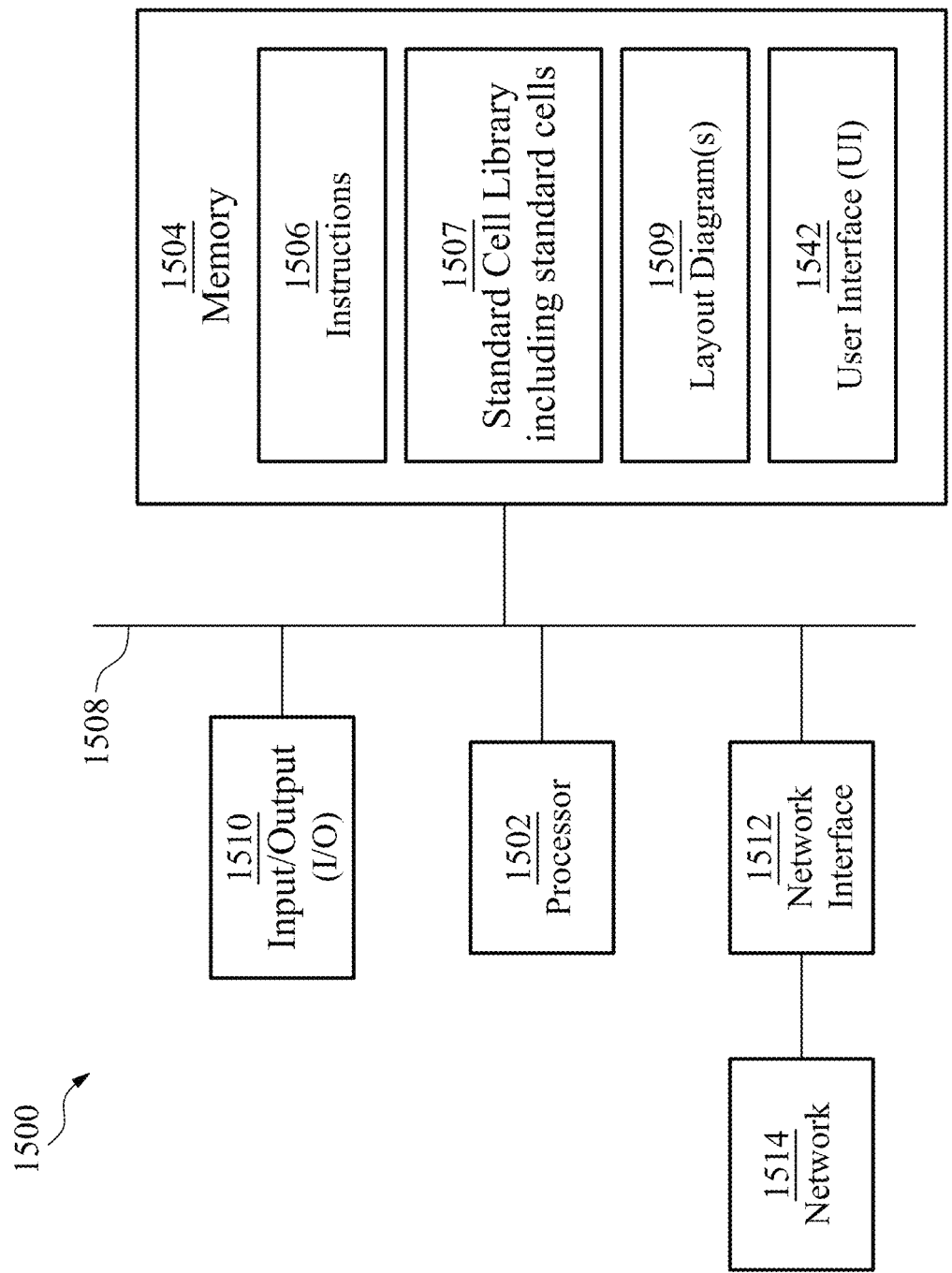
FIG. 15 is a block diagram of an electronic design automation (EDA) system, in accordance with some embodiments.

FIG. 15 is a block diagram of an electronic design automation (EDA) system 1500 in accordance with some embodiments.

In some embodiments, EDA system 1500 includes an APR system. Methods described herein of designing layout diagrams represent wire routing arrangements, in accordance with one or more embodiments, are implementable, for example, using EDA system 1500, in accordance with some embodiments.

In some embodiments, EDA system 1500 is a general purpose computing device including a hardware processor 1502 and a non-transitory, computer-readable storage medium 1504. Storage medium 1504, amongst other things, is encoded with, i.e., stores, computer program code 1506, i.e., a set of executable instructions. Execution of instructions 1506 by hardware processor 1502 represents (at least in part) an EDA tool which implements a portion or all of the methods described herein in accordance with one or more embodiments (hereinafter, the noted processes and/or methods).

Processor 1502 is electrically coupled to computer-readable storage medium 1504 via a bus 1508. Processor 1502 is also electrically coupled to an I/O interface 1510 by bus 1508. A network interface 1512 is also electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause system 1500 (where such execution represents (at least in part) the EDA tool) to be usable for performing a portion or all of the noted processes and/or methods. In one or more embodiments, storage medium 1504 also stores information which facilitates performing a portion or all of the noted processes and/or methods. In one or more embodiments, storage medium 1504 stores library 1507 of standard cells including such standard cells as disclosed herein. In one or more embodiments, storage medium 1504 stores one or more layout diagrams 1509 corresponding to one or more layouts disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 also includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1500.

System 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in computer-readable medium 1504 as user interface (UI) 1542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 16:
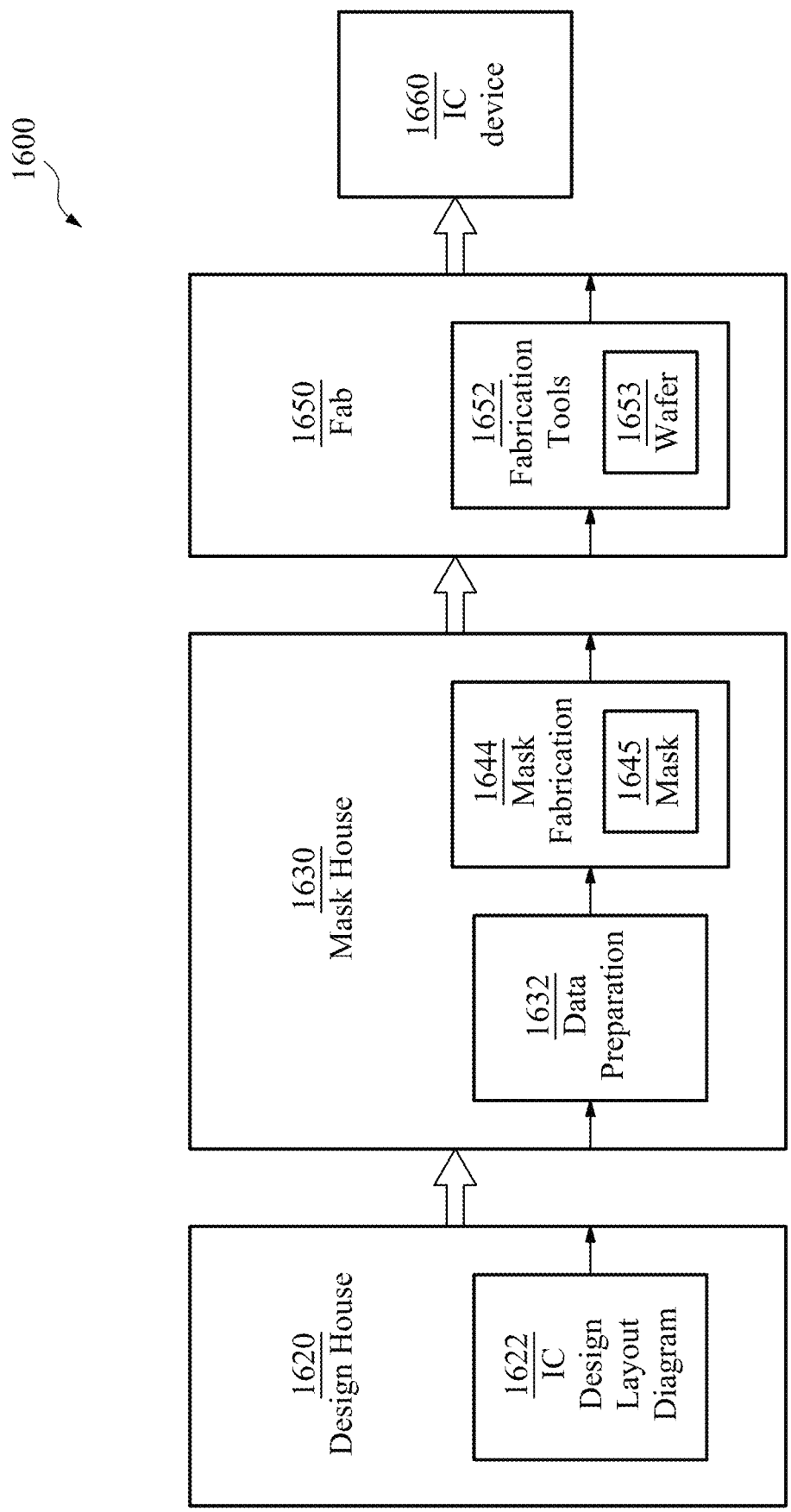
FIG. 16 is a block diagram of an integrated circuit (IC) manufacturing system, and an IC manufacturing flow associated therewith, in accordance with some embodiments.

FIG. 16 is a block diagram of an integrated circuit (IC) manufacturing system 1600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1600.

In FIG. 16, IC manufacturing system 1600 includes entities, such as a design house 1620, a mask house 1630, and an IC manufacturer/fabricator ("fab") 1650, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1650 is owned by a single larger company. In some embodiments, two or more of design house 1620, mask house 1630, and IC fab 1650 coexist in a common facility and use common resources.

Design house (or design team) 1620 generates an IC design layout diagram 1622. IC design layout diagram 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout diagram 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout diagram 1622. The design procedure includes one or more of logic design, physical design or place and route. IC design layout diagram 1622 is presented in one or more data files having information of the geometrical patterns. For example, IC design layout diagram 1622 can be expressed in a GDSII file format or DFII file format.

Mask house 1630 includes data preparation 1632 and mask fabrication 1644. Mask house 1630 uses IC design layout diagram 1622 to manufacture one or more masks 1645 to be used for fabricating the various layers of IC device 1660 according to IC design layout diagram 1622. Mask house 1630 performs mask data preparation 1632, where IC design layout diagram 1622 is translated into a representative data file ("RDF"). Mask data preparation 1632 provides the RDF to mask fabrication 1644. Mask fabrication 1644 includes a mask writer. A mask writer converts the RDF to an image on a substrate, such as a mask (reticle) 1645 or a semiconductor wafer 1653. The design layout diagram 1622 is manipulated by mask data preparation 1632 to comply with particular characteristics of the mask writer and/or requirements of IC fab 1650. In FIG. 16, mask data preparation 1632 and mask fabrication 1644 are illustrated as separate elements. In some embodiments, mask data preparation 1632 and mask fabrication 1644 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout diagram 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout diagram 1622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1622 to compensate for limitations during mask fabrication 1644, which may undo part of the modifications performed by OPC in order to meet mask creation rules.

In some embodiments, mask data preparation 1632 includes lithography process checking (LPC) that simulates processing that will be implemented by IC fab 1650 to fabricate IC device 1660. LPC simulates this processing based on IC design layout diagram 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1622.

It should be understood that the above description of mask data preparation 1632 has been simplified for the purposes of clarity. In some embodiments, data preparation 1632 includes additional features such as a logic operation (LOP) to modify the IC design layout diagram 1622 according to manufacturing rules. Additionally, the processes applied to IC design layout diagram 1622 during data preparation 1632 may be executed in a variety of different orders.

After mask data preparation 1632 and during mask fabrication 1644, a mask 1645 or a group of masks 1645 are fabricated based on the modified IC design layout diagram 1622. In some embodiments, mask fabrication 1644 includes performing one or more lithographic exposures based on IC design layout diagram 1622. In some embodiments, an electron-beam (e-beam) or a mechanism of multiple e-beams is used to form a pattern on a mask (photomask or reticle) 1645 based on the modified IC design layout diagram 1622. Mask 1645 can be formed in various technologies. In some embodiments, mask 1645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1645 includes a transparent substrate (e.g., fused quartz) and an opaque material (e.g., chromium) coated in the opaque regions of the binary mask. In another example, mask 1645 is formed using a phase shift technology. In a phase shift mask (PSM) version of mask 1645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1644 is used in a variety of processes. For example, such a mask(s) is used in an ion implantation process to form various doped regions in semiconductor wafer 1653, in an etching process to form various etching regions in semiconductor wafer 1653, and/or in other suitable processes.

IC fab 1650 is an IC fabrication business that includes one or more manufacturing facilities for the fabrication of a variety of different IC products. In some embodiments, IC Fab 1650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1650 includes fabrication tools 1652 configured to execute various manufacturing operations on semiconductor wafer 1653 such that IC device 1660 is fabricated in accordance with the mask(s), e.g., mask 1645. In various embodiments, fabrication tools 1652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1650 uses mask(s) 1645 fabricated by mask house 1630 to fabricate IC device 1660. Thus, IC fab 1650 at least indirectly uses IC design layout diagram 1622 to fabricate IC device 1660. In some embodiments, semiconductor wafer 1653 is fabricated by IC fab 1650 using mask(s) 1645 to form IC device 1660. In some embodiments, the IC fabrication includes performing one or more lithographic exposures based at least indirectly on IC design layout diagram 1622. Semiconductor wafer 1653 includes a silicon substrate or other proper substrate having material layers formed thereon. Semiconductor wafer 1653 further includes one or more of various doped regions, dielectric features, multi-level interconnects, and the like (formed at subsequent manufacturing steps).

Details regarding an integrated circuit (IC) manufacturing system (e.g., system 1600 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

According to an aspect, an integrated circuit includes an array of metal conducting lines in a metal layer overlying an insulation layer supported by a substrate, a first metal segment lineup having multiple metal segments in the metal layer between a first metal conducting line and a second metal conducting line in the array of metal conducting lines, and an electric circuit having a first input and a second input. The first input is connected to the first metal conducting line and the second input is connected to the second metal conducting line, and a first length of the first metal conducting line is equal to a second length of the second metal conducting line.

According to another aspect, an integrated circuit includes an array of metal conducting lines in a metal layer overlying an insulation layer supported by a substrate, a first metal segment lineup having multiple metal segments in the metal layer between a first metal conducting line and a second metal conducting line in the array of metal conducting lines, and wherein at least one of the multiple metal segments is a dummy conductor, and a capacitor having a first electrode and a second electrode. The first electrode includes the first metal conducting line and the second electrode includes the second metal conducting line.

According to another aspect, a method includes depositing a metal layer overlying an insulation layer supported by a substrate; depositing a hard mask layer overlying the metal layer; creating a first photoresist pattern on the hard mask layer with a first photolithography mask; forming a hard mask in the hard mask layer based on the first photoresist pattern; creating a second photoresist pattern on the hard mask and the metal layer with a second photolithography mask; etching the metal layer and forming an array of metal conducting lines and an array of metal segment lineups in the metal layer based on the hard mask and the second photoresist pattern, wherein a first length of a first metal conducting line is equal to a second length of a second metal conducting line, wherein the array of metal segment lineups is interlaced with the array of metal conducting lines, and wherein a metal segment lineup in the array of metal segment lineups includes multiple metal segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   an array of metal conducting lines in a metal layer overlying an insulation layer supported by a substrate;
   a first metal segment lineup having multiple metal segments in the metal layer between a first metal conducting line and a second metal conducting line in the array of metal conducting lines; and
   an electric circuit having a first input and a second input, wherein the first input is connected to the first metal conducting line and the second input is connected to the second metal conducting line, and wherein a first length of the first metal conducting line is equal to a second length of the second metal conducting line.

2. The integrated circuit of claim 1, wherein at least two of the metal segments are a dummy conductor which does not carry time-varying signals.

3. The integrated circuit of claim 1, wherein each of the metal segments is a dummy conductor which does not carry time-varying signals.

4. The integrated circuit of claim 1, wherein each of the metal segments is configured to be maintained at a constant voltage.

5. The integrated circuit of claim 1, wherein the electric circuit is a differential amplifier, and wherein the first input is a non-inverting input and the second input is an inverting input.

6. The integrated circuit of claim 1, comprising:
an array of metal segment lineups in the metal layer interlacing with the metal conducting lines, wherein one of the metal conducting lines is between two metal segment lineups.

7. The integrated circuit of claim 6, wherein the array of metal segment lineups includes the first metal segment lineup having a first metal segment and a second metal segment lineup having a second metal segment, and wherein the first metal segment and the second metal segment are aligned along a first direction at either side of the one of the metal conducting lines that extends in a second direction which is perpendicular to the first direction.

8. An integrated circuit comprising:
an array of metal conducting lines in a metal layer overlying an insulation layer supported by a substrate;
a first metal segment lineup having multiple metal segments in the metal layer between a first metal conducting line and a second metal conducting line in the array of metal conducting lines, and wherein at least one of the multiple metal segments is a dummy conductor; and
a capacitor having a first electrode and a second electrode, wherein the first electrode includes the first metal conducting line and the second electrode includes the second metal conducting line.

9. The integrated circuit of claim 8, wherein each of the metal segments is a dummy conductor which does not carry time-varying signals.

10. The integrated circuit of claim 8, wherein a first length of the first metal conducting line is equal to a second length of the second metal conducting line.

11. The integrated circuit of claim 8, wherein each of the metal segments is configured to be maintained at a constant voltage.

12. The integrated circuit of claim 8, wherein the array of metal conducting lines includes a group of first metal conducting lines and a group of second metal conducting lines, and wherein the first electrode of the capacitor includes the group of the first metal conducting lines and the second electrode of the capacitor includes the group of the second metal conducting lines.

13. The integrated circuit of claim 12, comprising:
an array of metal segment lineups in the metal layer interlacing with the metal conducting lines, wherein a metal conducting line is between two metal segment lineups.

14. The integrated circuit of claim 12, comprising:
a first lead conducting line extending in a first direction and conductively connected to the first metal conducting lines;
a second lead conducting line extending in the first direction and conductively connected to the second metal conducting lines; and
wherein the first metal conducting lines and the second metal conducting lines are all extending in a second direction that is perpendicular to the first direction.

15. The integrated circuit of claim 14, wherein the first lead conducting line and the second lead conducting line are in the metal layer having the first metal conducting lines and the second metal conducting lines.

16. The integrated circuit of claim 14, wherein the first lead conducting line and the second lead conducting line are in another metal layer that is different from the metal layer having the first metal conducting lines and the second metal conducting lines.

17. An integrated circuit comprising:
an array of metal conducting lines having a first metal conducting line and a second metal conducting line each extending in a first direction in a metal layer overlying an insulation layer supported by a substrate;
a first metal segment lineup having a first metal segment and a second metal segment extending in the first direction in the metal layer between the first metal conducting line and the second metal conducting line and aligned with each other along the first direction, wherein each of the first metal segment and the second metal segment is configured to be maintained at a constant voltage; and
a differential amplifier having a first input connected to the first metal conducting line and having a second input connected to the second metal conducting line.

18. The integrated circuit of claim 17, wherein a first length of the first metal conducting line is equal to a second length of the second metal conducting line.

19. The integrated circuit of claim 17, further comprising:
a second metal segment lineup having a third metal segment and a fourth metal segment extending in the first direction in the metal layer and aligned with each other along the first direction, and wherein the first metal conducting line is between the first metal segment lineup and the second metal segment lineup.

20. The integrated circuit of claim 19, wherein the first metal segment in the first metal segment lineup and the third metal segment in the second metal segment lineup are aligned along a second direction across the first metal conducting line, wherein the second direction is perpendicular to the first direction.

\* \* \* \* \*